(12) United States Patent
Castaneda et al.

(10) Patent No.: US 7,817,969 B2
(45) Date of Patent: Oct. 19, 2010

(54) LIMITING AUDIBLE NOISE INTRODUCTION THROUGH FM ANTENNA TUNING

(75) Inventors: Jesus Alfonso Castaneda, Los Angeles, CA (US); Seema B. Anand, Ranchos Palos Verdes, CA (US); Maryam Rofougaran, Rancho Palos Verdes, CA (US); Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 532 days.

(21) Appl. No.: 11/858,957

(22) Filed: Sep. 21, 2007

(65) Prior Publication Data

US 2008/0192807 A1 Aug. 14, 2008

Related U.S. Application Data

(60) Provisional application No. 60/889,528, filed on Feb. 12, 2007.

(51) Int. Cl.
*H04B 1/04* (2006.01)
(52) U.S. Cl. ............... 455/114.2; 455/63.1; 455/296; 375/346
(58) Field of Classification Search ............ 455/63.1, 455/114.2, 296; 375/346
See application file for complete search history.

(56) References Cited

U.S. PATENT DOCUMENTS

| | | | | |
|---|---|---|---|---|
| 5,303,414 A | * | 4/1994 | Brinkhaus | 455/296 |
| 5,339,463 A | * | 8/1994 | Hansen | 455/213 |
| 5,812,673 A | * | 9/1998 | Nohara et al. | 381/13 |
| 6,097,773 A | * | 8/2000 | Carter et al. | 375/347 |
| 6,456,833 B1 | * | 9/2002 | Sessink | 455/212 |
| 7,127,218 B2 | * | 10/2006 | Lindenmeier | 455/101 |

* cited by examiner

*Primary Examiner*—Nhan Le
(74) *Attorney, Agent, or Firm*—Garlick Harrison & Markison; Kevin L. Smith

(57) ABSTRACT

An FM receiver including an FM antenna that receives continuous wavelength signals, where the FM receiver is coupled to the FM antenna and operable to alter a center frequency of a gain profile of the FM antenna. The FM receiver includes a low noise amplifier module that is coupled to amplify the continuous wavelength signal to produce an amplified RF signal therefrom. A down conversion module is coupled to mix the amplified RF signal with a local oscillation to produce an information signal. A filter module is coupled to filter the information signal to produce a filtered information signal. A demodulation module is coupled to capture audio information from the filtered information signal. A signal monitoring module is coupled to monitor the FM signal quality of a received continuous wavelength signal. The signal monitoring module produces a signal quality indication therefrom. An antenna control module produces a signal value based upon the signal quality indication, wherein the signal value operates to alter the center frequency of a gain profile of the FM antenna.

8 Claims, 15 Drawing Sheets recovery operation tracking operation mobile phone 22 mobile phone 28

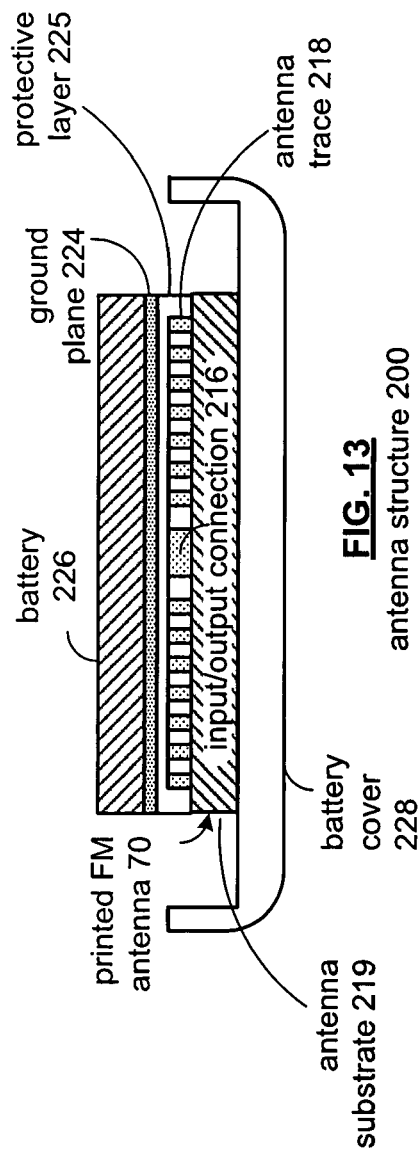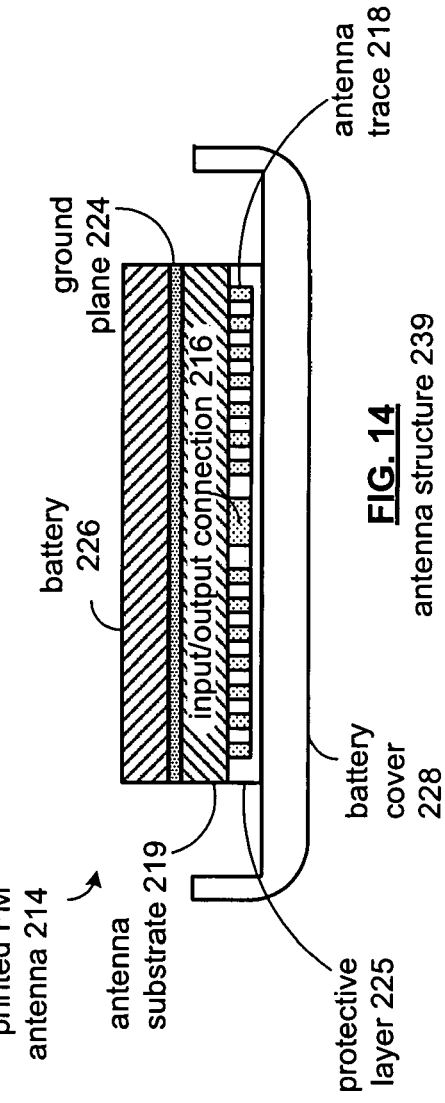

antenna structure 230

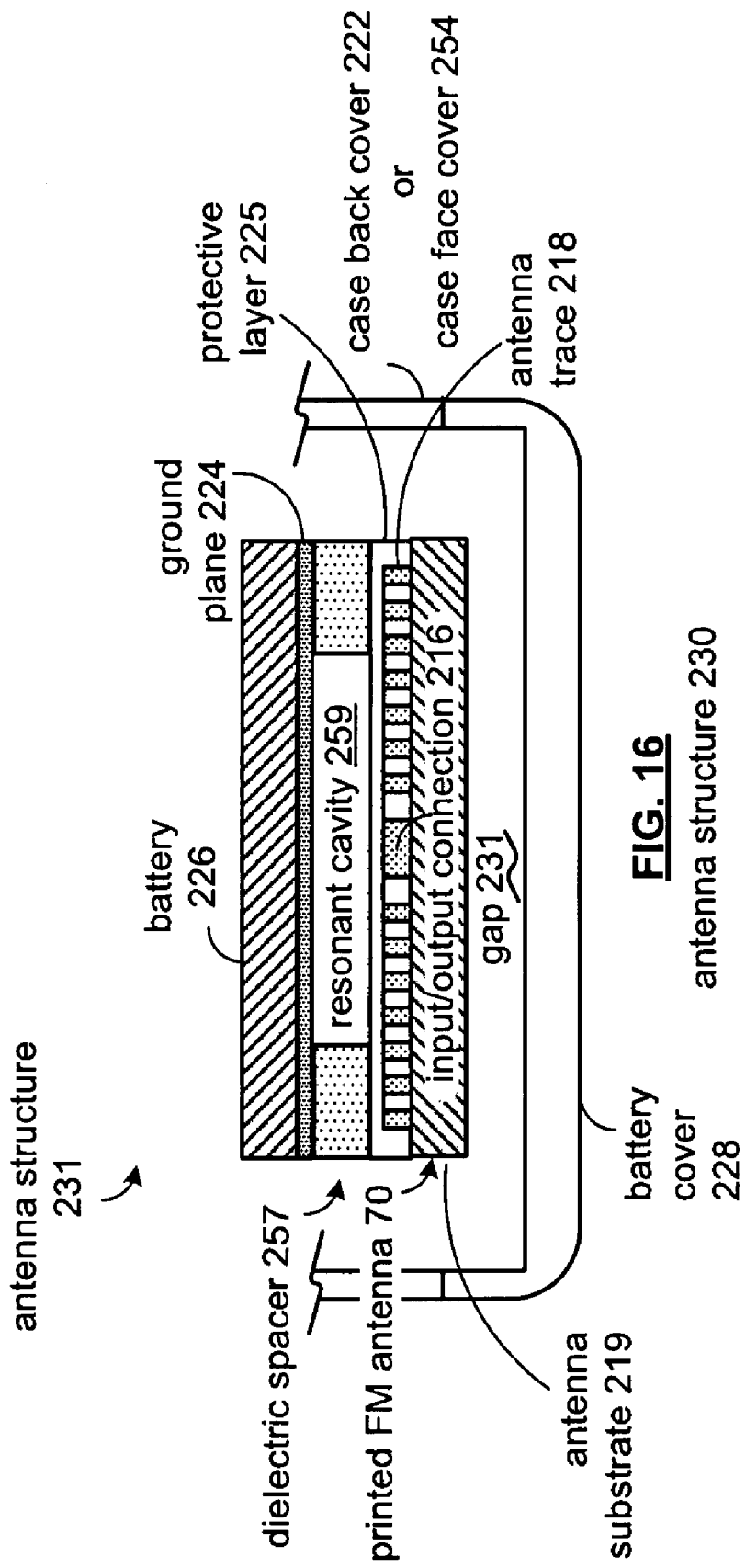

LIMITING AUDIBLE NOISE INTRODUCTION THROUGH FM ANTENNA TUNING

CROSS REFERENCE TO RELATED APPLICATIONS

This application claims priority to U.S. Provisional Application Ser. No. 60/889,528 entitled "Mobile Phone with an Antenna Structure having Improved Performance," filed Feb. 12, 2007, which is hereby incorporated herein by reference in its entirety for all purposes.

SPECIFICATION

1. Technical Field

The present invention relates to wireless communications and, more particularly, signal reception and transmission in mobile wireless communication systems.

2. Related Art

Communication systems are known to support wireless and wire-lined communications between wireless and/or wire-lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a mobile telephone, two-way radio, personal digital assistant (PDA), personal computer (PC), laptop computer, home entertainment equipment, et cetera, communicates directly or indirectly with other wireless communication devices. For direct communications (also known as point-to-point communications), the participating wireless communication devices tune their receivers and transmitters to the same channel or channels (for example, one of a plurality of radio frequency (RF) carriers of the wireless communication system) and communicate over that channel(s).

For indirect wireless communications, each wireless communication device communicates directly with an associated base station (for example, for cellular services), and/or an associated access point (for example, for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (that is, a receiver and a transmitter) or is coupled to an associated radio transceiver (for example, a station for in-home and/or in-building wireless communication networks, radio frequency (RF) modem, et cetera). Further, such wireless communication devices may have additional content features such as FM signal reception. In general, FM receivers receive FM program broadcasts for media content playback to a user.

An antenna is an essential element for a wireless communication device. The antenna provides a wireless interface may be a radio, mobile phone, pager, station (such as for wireless local area network, wireless Internet, FM signals), et cetera. The particular type of wireless communication system, which prescribes the transmission frequencies, reception frequencies and power levels, dictates the performance requirements for the antenna.

Because most wireless communication devices are handheld or portable devices, each component used in these devices must be small, efficient, economical and lightweight—generally, these components are provided in forms of systems-on-chips or other integrated circuits. The antenna is no exception—it too must be small, efficient, economical and lightweight. To achieve these requirements, many antennas have been developed having various structures including monopole, dipole, et cetera.

The diminutive size of the antennas, however, leave them more susceptible to operational environmental changes, which in turn affect the ability of an antenna to reliably receive and/or transmit signals. For example, wireless communication devices can be readily held within the grasp of a user, or placed within a pocket, et cetera. For example, in FM reception, when operational environmental conditions change, the impedance changes, and consequently, adversely affecting the reception capability of the antenna by reducing the signal-to-noise performance for the antenna.

Although favorable operational environmental conditions may return, a user becomes frustrated by the inconsistency of their content service for their mobile phone or device—either through loss of the signal, or interference with the signal quality. Therefore, a need exists for miniaturized integrated circuit systems to be able to limit audible noise introduction to rapidly recover or to track the tuning of an FM antenna.

SUMMARY

The present invention is directed to apparatus and methods of operation that are further described in the following Brief Description of the Drawings, the Detailed Description of the Drawings, and the claims. Other features and advantages of the present invention will become apparent from the following detailed description of the drawings made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 13 is a cross-sectional diagram of an antenna structure including a printed FM antenna in a first orientation according to an embodiment of the present invention;

FIG. 14 is a cross-sectional diagram of an antenna structure including a printed FM antenna in a second orientation according to another embodiment of the invention;

FIG. 16 is a cross-sectional diagram of the antenna structure of FIG. 13.

DETAILED DESCRIPTION OF THE DRAWINGS

Figure 1:
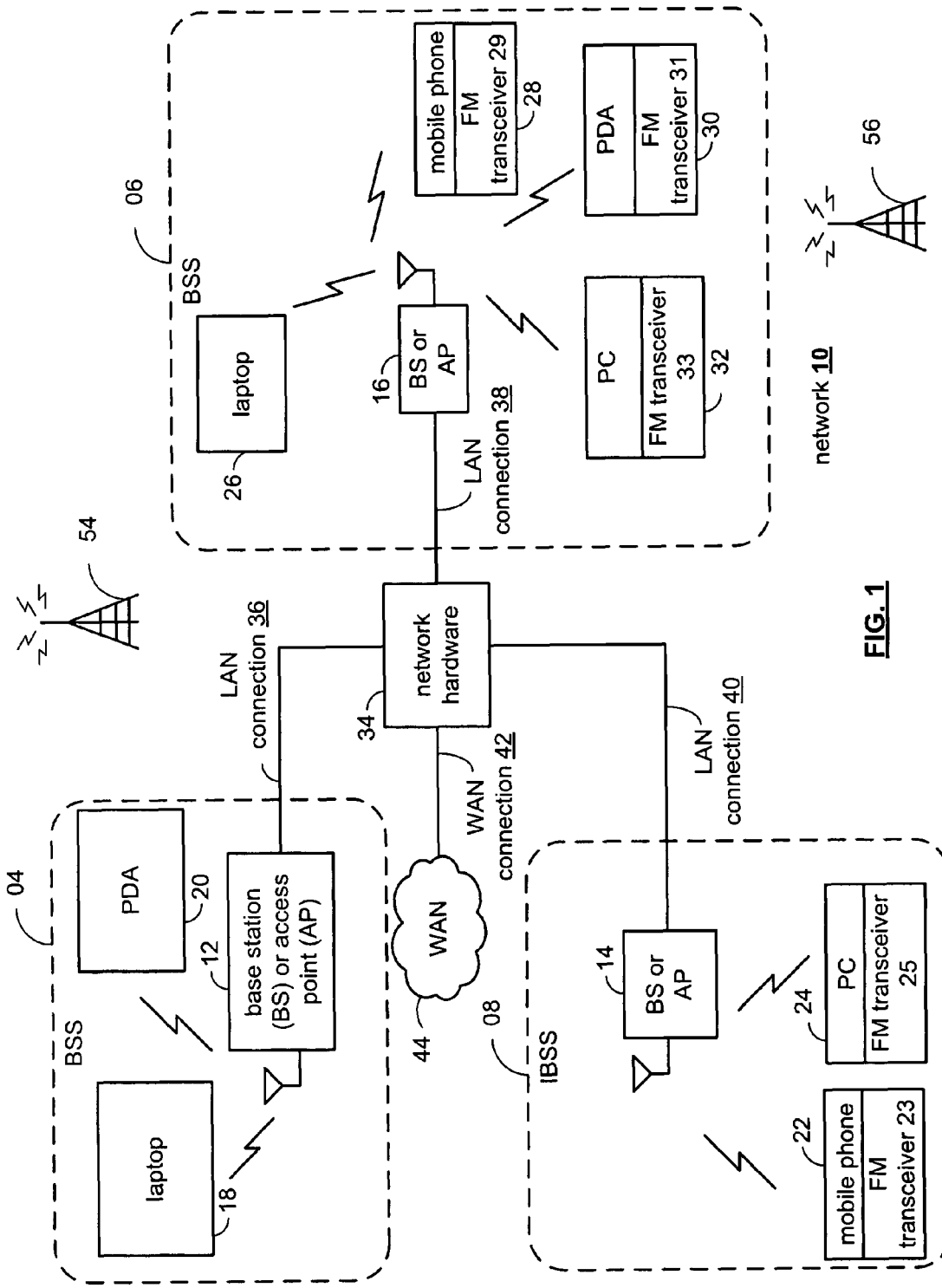
FIG. 1 is a functional block diagram illustrating a communication system that includes a plurality of base stations or access points (APs), a plurality of broadcast stations, a plurality of wireless communication devices and a network hardware component.

FIG. 1 is a functional block diagram illustrating a communication system that includes circuit devices and network elements and operation thereof. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or mobile telephones 22 and 28.

The base stations or APs 12-16 are operably coupled to the network hardware component 34 via local area network (LAN) connections 36, 38 and 40. The network hardware component 34, which may be a router, switch, bridge, modem, system controller, et cetera, provides a wide area network connection 42 for the communication system 10 to an external network element. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (that is, point-to-point communications), wireless communication devices communicate directly via an allocated channel.

Some or all of the wireless communication devices 18-32 may include a FM transceiver to receive and/or transmit continuous waveform signals in the FM frequency broadcast band, which in the United States is 87.9 to 107.9 MHz. It can be appreciated, however, that FM signals may be transmitted on any frequency. In the present example, wireless communication devices 22, 24, 28, 30, and 32 include FM transceivers 23, 25, 31, 33, and 35, respectively. In this manner, the wireless communication devices may receive and/or transmit media content via FM frequency transmission techniques.

In addition to media content (such as audio, video, et cetera), a wireless communication device may receive and/or transmit additional information such as Radio Data System ("RDS") information, which provides digital information regarding FM radio broadcasts. This information can include items such as time, track/artist information, station identification, et cetera.

FM broadcast stations 54 and 56 transmit media content over continuous wavelength signals in the FM band, in which the FM transceivers 23-33 receive via their respective FM antennas. The FM transceivers then process the signals for playback of the media content to a user device. Also, the wireless communication devices may transmit FM signals as a local broadcast to nearby audio devices having FM receivers, such as personal stereos, automobile FM radios, et cetera.

The FM receivers include digitally-controlled tuning circuitry to improve the antenna FM performance, and limit audible noise introduction, by compensating for non-ideal operational environmental conditions for small wireless devices. The digitally-controlled tuning circuitry also limits audible noise introduction via the two tuning modes, which include recovery operations and tracking operations.

Non-ideal operational environmental conditions may occur, for example, by the position of a human body with respect to a device's FM antenna—in general, the proximate position of a user affects and/or changes the impedance of the FM antenna (such as when the wireless device being clasped in a user's hand, stored in a pocket, notebook, et cetera). As the person moves either closer to or further away from the device's antenna, the impedance of the antenna to change, affecting the center frequency of the FM antenna's gain profile. Also, non-ideal operational environmental condition by signal attenuation brought on by buildings, tunnels, and other forms of obstructions.

In limiting audible noise introduction through FM antenna tuning, the receiver improves antenna FM performance by rapidly recovering or tracking an FM broadcast channel. The recovery or tracking operations are performed by altering the center frequency of the FM antenna gain profile to compensate for these environmental changes.

When less than ideal reception conditions occur (that is, the signal-to-noise ratio worsens and/or signal strength decreases), stereo FM broadcast playback transitions to mono or the FM signal may altogether be dropped. Ever varying environmental conditions and noise introduction produces inconsistent media content playback that frustrates users. FM antenna tuning circuitry and FM antenna structures implemented for recovery and/or tracking operations are discussed in greater detail with reference to FIGS. 2 through 16.

Figure 2:
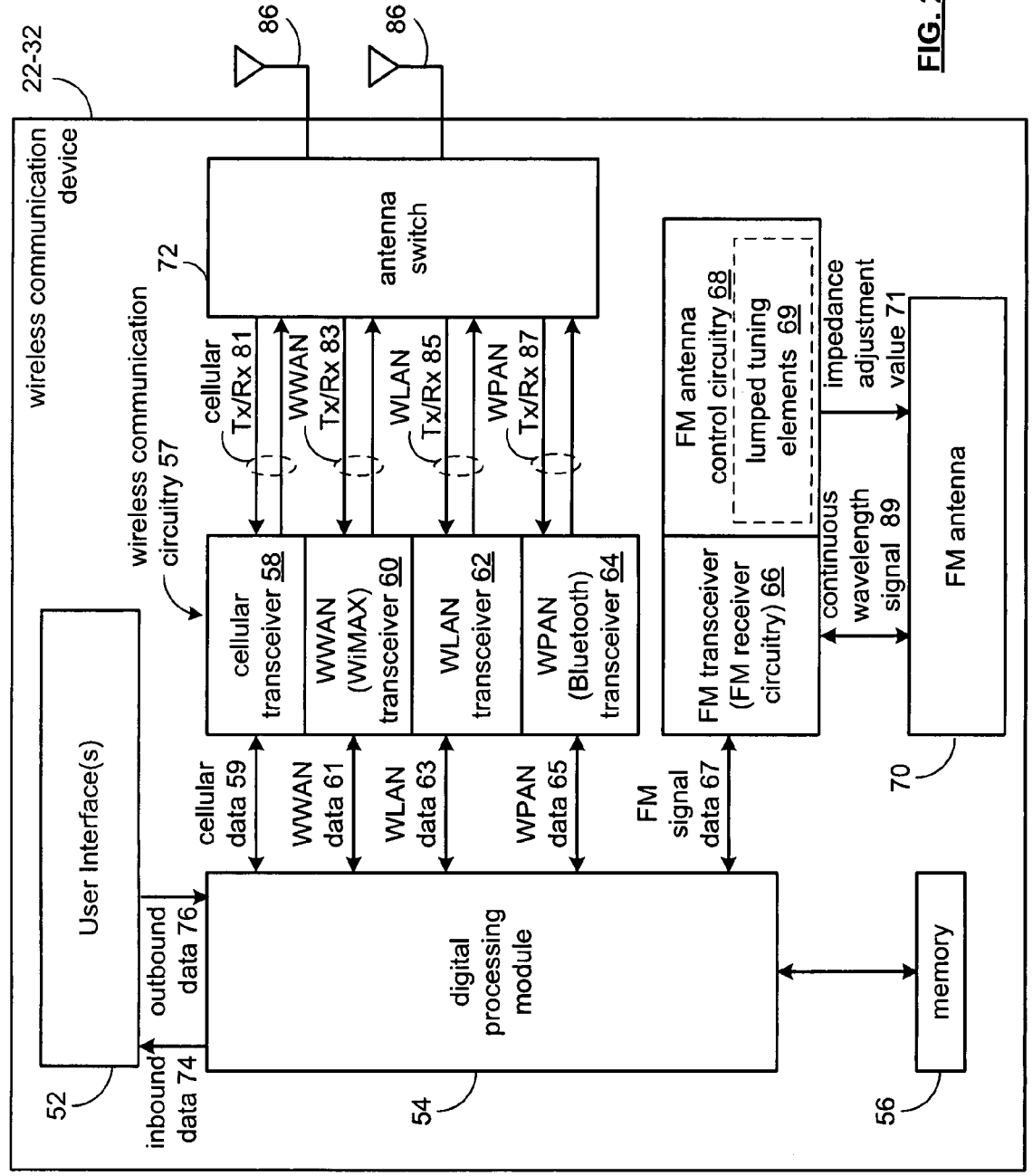
FIG. 2 is a schematic block diagram illustrating a wireless communication device architecture including an FM transceiver and an FM antenna tuning module according to an embodiment of the present invention.

FIG. 2 is a schematic block diagram illustrating a wireless communication device 22-32. As illustrated, wireless communication device 22-32 includes a digital processing module 54, a memory 56, user interface(s) 52, transceivers 58-66, an FM antenna control circuitry 68, a FM antenna 70, and antenna switch 72. The digital processing module 54 and memory 56 execute instructions and perform corresponding communication functions in accordance with a particular mobile and/or cellular phone standard.

User interface(s) 52 allows data to be received from and provides connectivity to an output device such as a display, monitor, speakers, microphone, et cetera, such that the received data may be displayed and/or presented. The digital processing module 54 may also receive the outbound data from an input device such as a keyboard, keypad, microphone, et cetera, via the user interface(s) 52 or generate the data itself. The user interface provides outbound data 76 to the digital processing module 54 for transmission via one of the transceivers 58-66. The user interface also receives inbound data 74 destined for a user.

The wireless communication device 22-32 includes several transceivers (that is, receiver and transmitter) for accommodating different communication and/or data sessions. The wireless communication device 22-32 includes a cellular transceiver 58 (for example, Personal Communication System (PCS), Global System for Mobile Communications (GSM), Wideband CDMA, et cetera), a Wireless Wide Area Network (WWAN) transceiver 60 (for example, WiMAX, HSDPA, et cetera), a Wireless LAN (WLAN) transceiver 62 (for example, IEEE 802.11), a Wireless Personal Area Network (WPAN) transceiver 64 (for example, Bluetooth, IEEE 802.15, et cetera), and a FM transceiver 66.

The transmitter portion of a transceiver generally includes a data modulation stage, one or more intermediate frequency stages, and a power amplifier stage. The data modulation stage converts raw data into baseband signals in accordance with the particular wireless communication standards specification. The one or more intermediate frequency stages mix the baseband signals with one or more local oscillations to produce RF signals. The power amplifier stage amplifies the RF signals prior to transmission via an antenna.

A transceiver's receiver portion generally includes a low noise amplifier (LNA) stage, one or more intermediate frequency stages, and a data demodulation stage. The LNA stage amplifies the received RF signals for providing a stronger signal for subsequent processing. The one or more intermediate frequency stages mix the RF signals with one or more local oscillations to produce baseband signals, in accordance with the particular wireless communication standards specification. In other transceiver configurations, a received FM signal may be converted directly to baseband signals. The data demodulation stage operates to convert the baseband signals into raw data.

The transceivers 58-64 receive and transmit RF signals via the antenna switch 72, which operates to couple the receivers to the antenna 86 in a receive mode, and to couple the transmitters in a transmit mode. The antenna switch 72 provides a many-to-one access to the antenna 86 for providing efficient use of antenna resources. Examples of antenna switches are discussed in further detail in U.S. Pat. No. 7,079,816, entitled "On Chip Diversity Antenna Switch," issued Jul. 18, 2006, which is hereby incorporated herein by reference.

The FM transceiver 66 receives continuous waveform signals 89 from an FM transmitter, such as FM broadcast stations 54 and 56 (see FIG. 1), via the FM antenna 70. Also, the FM transceiver 66 may transmit a continuous waveform signal 89 in the FM band to a local receiver (such as a personal stereo, automobile FM radio, et cetera).

An FM antenna tuning module 68, which includes lumped tuning elements 69, operates to adjust the impedance match with the FM antenna 70 with an impedance adjustment value 71 in recovery operation and/or tracking operation, which are discussed in further detail with respect to FIGS. 3-10.

The FM antenna 70 may be provided under a variety of configurations, such as a monopole antenna, a dipole antenna (for example, such as the dipole antenna depicted in U.S. Pat. No. 7,034,770, entitled "Printed Dipole Antenna," issued Apr. 25, 2006, which is hereby incorporated herein by reference), an eccentric spiral antenna (for example, such as the eccentric spiral antenna depicted in U.S. Pat. No. 6,947,010, entitled "Eccentric Spiral Antenna," issued Apr. 4, 2000, which is hereby incorporated herein by reference), a fractal element antenna, et cetera. Each configuration may have different design considerations.

As an example, a monopole antenna may have improved performance over a dipole antenna structure due to the lower ohmic loss of the antenna traces (that is, fewer antenna traces can be used with a monopole structure). In general, a lower ohmic loss provides the FM antenna 70 with higher antenna efficiency.

The monopole structure relies on the existing ground of the mobile phone 22 to generate an image of the "missing" portion (that is, the "dipole" portion for the monopole antenna). Because the wireless device may not have a perfect ground available for attachment of a monopole antenna structure, the impedance matching may be unpredictable. The overall performance of a monopole antenna, however, may be improved through a lower ohmic loss of the antenna trace 218 with respect to small antenna "footprints".

Lower ohmic loss for an antenna may also be recognized by operating an antenna at a higher resonant frequency, $f_C$. For example, the FM antenna 70 has a higher resonant frequency (such as two-to-three times higher) than the intended operational frequency (in the present example, the FM frequency band). The higher resonant frequency permits the electrical length of the antenna to be reduced, and correspondingly, the amount of space allocated for the antenna trace. That is, a shorter electrical length has fewer trace windings that can have larger trace surfaces in a given antenna area—the result is a lower ohmic loss. In operation with the FM transceiver 66, the receiver reduces the resonant frequency of the FM antenna 70 to the intended frequency resonance using discrete (or lumped) low-loss antenna matching components, such as the lumped tuning elements 69.

A trade off, however, exists between the highest resonant frequency to which the antenna is tuned versus the amount of impedance matching (via the FM antenna control circuitry 68) to bring the resonant frequency within the desired operational frequency. For instance, when the antenna resonates at a very high frequency, the required amount of impedance matching can be excessive, consequently producing excessive antenna loss. In other words, the advantage of having a lower ohmic loss and higher antenna efficiency is lost. On the other hand, when the antenna resonates substantially close to the desired resonant frequency, fewer matching components would be needed; however, the resulting ohmic loss of the resulting FM antenna trace would be comparable or larger than the radiation resistance for the FM antenna 70.

Regardless of the antenna configuration deployed, the FM antenna 70 has a center frequency associated with its gain profile for the desired radio frequency band. The FM antenna control circuitry 68 operates to center the FM antenna 70 within a desired operational frequency in either of a recovery operation mode or a tracking operation mode, depending on the signal strength indication of the received continuous wavelength signal 89.

In a recovery operation mode, the FM antenna control circuitry 68 provides frequency hopping across the FM frequency band at a scanning frequency interval. The frequency hopping is conveyed via an adjustment control signal to the lumped tuning elements 69. The lumped tuning elements 69 correspondingly vary the impedance (and the resonance frequency) of the FM antenna 70 via an impedance adjustment value 71. The receiver determines a scanned frequency having a greatest signal quality information, and sets the center frequency of the gain profile of the FM antenna to that scanned frequency. The recovery operation mode is discussed in detail with reference to FIG. 8.

In a tracking operation mode, the FM antenna control circuitry 68 provides frequency hopping across the FM frequency band at a dithering frequency interval, which is less than the scanning frequency interval. The frequency hopping is conveyed via an adjustment control signal to the lumped tuning elements 69. The lumped tuning elements 69 correspondingly vary the impedance (and the resonance frequency) of the FM antenna 70 via an impedance adjustment value 71. The receiver determines a dithered frequency having a greatest signal quality information, and sets the center frequency of the gain profile of the FM antenna to that dithered frequency. The tracking operation mode is discussed in detail with reference to FIG. 9.

In this manner the receiver, through the digitally controlled antenna tuning circuitry, functions to limit audible noise introduction by altering the center frequency of the gain profile of the FM antenna at a rate sufficient to accommodate broadcast-content playback to a user in a dynamic operational environment. That is, the user does not perceive or sense the interference otherwise caused by the an ever-changing operational environment—save for the instance where a signal is irreparably lost.

The lumped tuning elements 69 include voltage-controlled variable impedance devices (such as a switched bank of impedance devices, varactors, varicap diodes, et cetera) to produce the impedance adjustment value 71. That is, by adjusting the impedance value through the lumped tuning elements 69, the FM antenna control circuitry 68 tunes the FM antenna 70 to the operational conditions of the wireless communication device 22-32. The structure of the lumped tuning elements with respect to recovery and tracking operation is discussed in detail with reference to FIG. 7.

The FM antenna control circuitry 68 and the lumped tuning elements 69 may be on a single integrated circuit, a plurality of integrated circuits, and/or a separately defined IC portion sharing a common semiconductor substrate. Also, the FM antenna tuning module and the lumped tuning elements 69 may be implemented as part of a system on a chip. Examples of other implementations are discussed in detail with reference to FIGS. 4 through 16.

The digital processing module 54, in combination with operational instructions stored in memory 56, executes digital receiver and digital transmitter functions. The digital processing module 54 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 56 may be a single memory device or a plurality of memory devices. Such a memory device may be a read-only memory, random access memory, volatile memory, non-volatile memory, static memory, dynamic memory, flash memory, and/or any device that stores digital information. Note that when digital processing module 54 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 56 stores, and digital processing module 54 executes, operational instructions corresponding to at least some of the functions illustrated and/or described herein.

In operation, the digital processing module 54 processes outbound data 76 in accordance with a particular wireless communication standard (for example, IEEE 802.11a, IEEE 802.11b, Bluetooth, IEEE 802.16, et cetera) to produce the appropriate digital transmission formatted data for a present communication session, which includes cellular data 59, WLAN data 61, WWAN data 65, and/or FM signal data 67. This data will be a digital baseband signal or a digital low IF signal, where the low IF typically will be in the frequency range of one hundred kilohertz to a few megahertz.

Each respective transceiver 58-66 converts the digital data from the digital domain to the analog domain. Though the antenna 86 is schematically depicted as external to the body of the radio, commercial versions of the wireless communication device generally incorporate the antenna element and structures within the body of the device. Also, the wireless communication device may also include additional antennas for standards specific applications, such as those for Bluetooth applications, et cetera.

As one of average skill in the art will appreciate, the wireless communication device of FIG. 2 may also be implemented using one or more integrated circuits. For example, the digital processing module 54 and memory 56 may be implemented on a second integrated circuit, and the remaining components of the wireless communication device 22-32, less antenna 86, may be implemented on a third integrated circuit. As an alternate example, the wireless communication device 22-32 may be implemented on a single integrated circuit.

Figure 3:
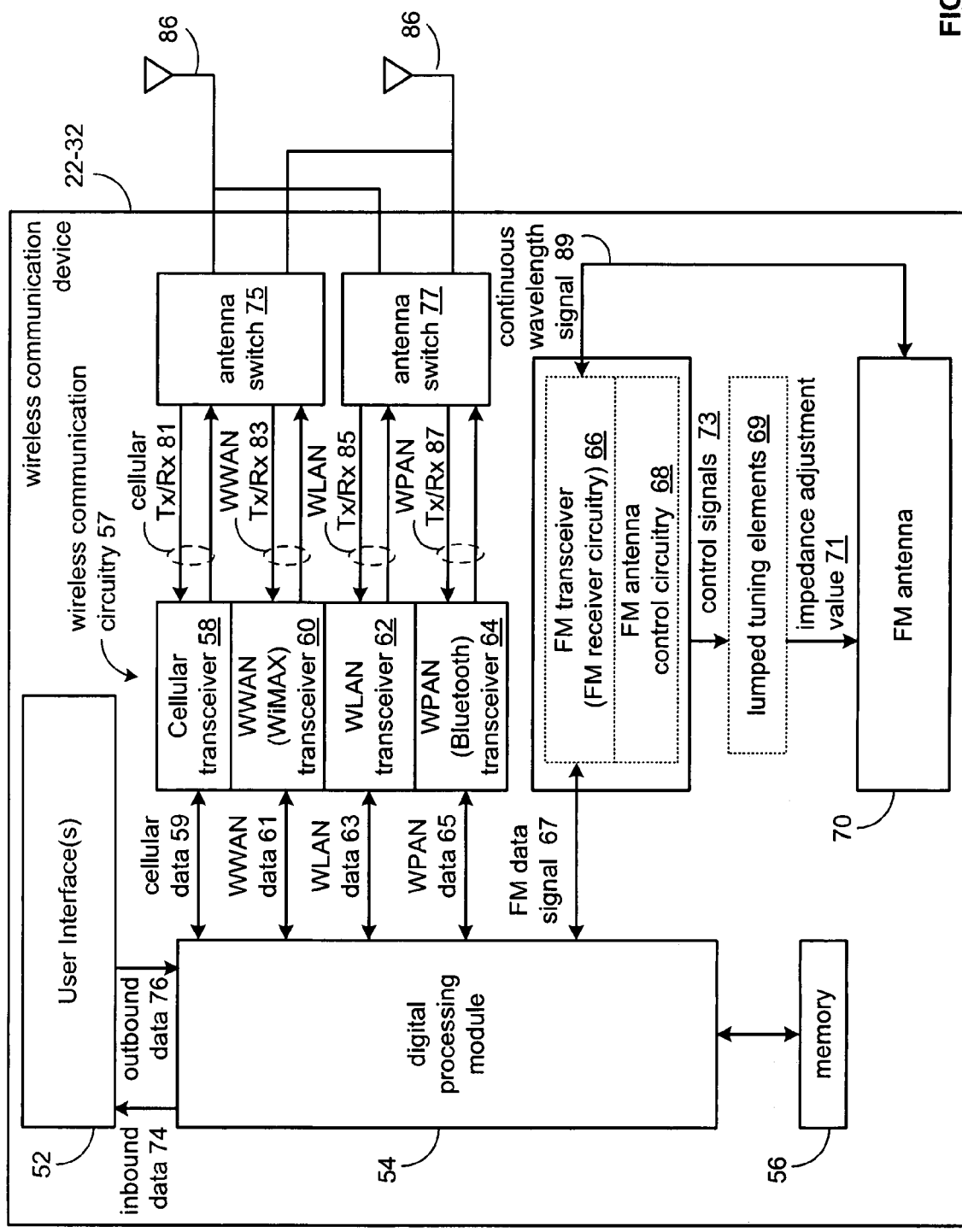
FIG. 3 is a schematic block diagram illustrating a wireless communication device architecture including an FM transceiver an FM antenna tuning module coupled with a tuning circuit according to an embodiment of the present invention.

FIG. 3 is a schematic block diagram illustrating a wireless communication device 22-32 that includes a distributed embodiment of the FM antenna control circuitry 68 and the lumped tuning elements 69.

As illustrated, the wireless communication device 22-32 includes a digital processing module 54 and a memory 56. The digital processing module 54 and memory 56 execute instructions and perform corresponding communication functions in accordance with a particular mobile and/or cellular phone standard. To the extent that like components and/or elements have been earlier described of the wireless communication device 22-32, the description will not be repeated here.

The wireless communication device 22-32 includes antenna switch 75 and antenna switch 77. Antenna switch 75 services the cellular Tx/Rx signal 81 and the WWAN Tx/Rx signal 83 for transmission and/or reception modes over the antenna 86. Antenna switch 77 services the WLAN Tx/Rx signal 85 and WPAN Tx/Rx signal 87 for transmission and/or reception modes over the antenna 86. The FM transceiver 66 receives and/or transmits a continuous wavelength signal 89 via the FM antenna 70.

Multiple antenna switches 75 and 77 permit each of the antenna switches to accommodate the characteristics of similar communications modes. Examples of characteristics may include similar frequency bands, similar data rates, et cetera. For example, an antenna switch may service cellular frequency bands (such as for AMPS, IS-95 (CDMA), IS-136 (D-AMPS), GSM, operating in the 824-849 MHz, 869-894 MHz, 896-901 MHz, and 935-940 MHz frequency bands), and another antenna switch may service Personal Communication Service ("PCS") frequency bands (such as for GSM, IS-95 (CDMA), IS-136 (D-AMPS), operating in the 1850-

1910 MHz and 1930-1990 MHz frequency bands). A further antenna switch may service high-data rate communications (such as 2.4 GHz).

The FM transceiver 66 receives, from the FM antenna 70, the continuous wavelength signal 89 via the printed FM antenna 70. The FM antenna control circuitry 68 receives a signal strength indication (SSI) from the FM transceiver 66. Also, the FM transceiver 66 may provide the received FM signal to the FM antenna control circuitry 68, in which signal strength or other signal characteristics may be evaluated to generate the control signals 73. When the SSI falls outside a permissible signal strength level, the lumped tuning elements 69 provide an impedance adjustment value 71 to the printed FM antenna based upon the control signals 73 from the FM antenna control circuitry 68.

The lumped tuning elements 69 are illustrated on a separately defined IC or a separately defined IC portion with respect to the FM transceiver 66 and the FM antenna control circuitry 68. In this manner, differing fabrication processes may be used to implement the impedance devices of the lumped tuning elements 69 and with processes to implement other components of the wireless communication device 22-32. That is, in some instances, a reduction in fabrication cost and complexity may be realized. Also, wireless communication devices may have an impedance bank accessible to other components within the device to permit shared access to those components (for example, for clock adjustment, et cetera).

By adjusting the impedance value of the lumped tuning elements 69, the FM antenna control circuitry 68 tunes the FM antenna 70 to an impedance of the communications device 22-32 according to whether the receiver is operating in a recovery operation or a tracking operation.

Figure 4:
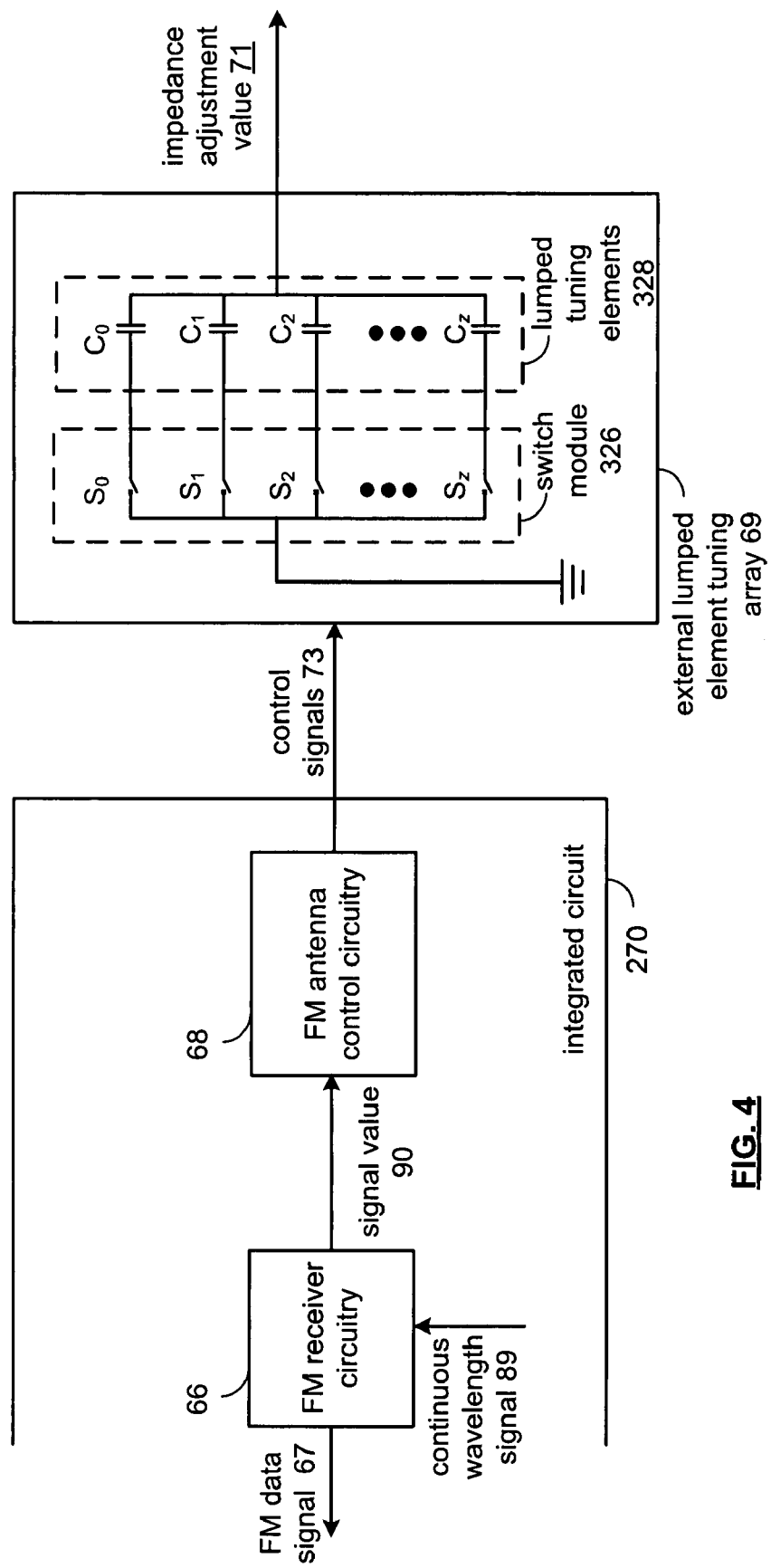
FIG. 4 is a schematic block diagram further illustrating an integrated circuit that supports wireless communications and includes FM receiver capability according to an embodiment of the present invention.

FIG. 4 is a schematic block diagram of an integrated circuit 270 that supports wireless communications and includes FM receiver capability. The integrated circuit 270 includes FM receiver circuitry 66 and FM antenna control circuitry 68. For support of wireless communications, the integrated circuit 270 also includes wireless communication circuitry 57 with transceivers 58 through 64 (see, e.g., FIGS. 2 and 3).

The FM antenna control circuit 68 produces control signals 73 to control a center frequency of a gain profile of an FM antenna, such as FM antenna 70 (see FIGS. 2 and 3). The external lumped element tuning array 69 includes a switch module 326 and lumped tuning elements 28. The external lumped element tuning array 69 is provided by a separately defined integrated circuit, such as in a mixed semiconductor structure or a portion of the integrated circuit with defined boundaries.

The switch module 326 includes a plurality of switches $S_0$ through $S_Z$ that are coupled to the lumped tuning elements 328 that includes a plurality of tuning elements $C_0$ through $C_Z$. The tuning elements may also be implemented in other configurations as voltage-controlled variable impedance devices (such as varactors, varicap diodes, et cetera). The plurality of switches $S_0$ through $S_Z$ operate to alter the impedance adjustment value 71 via the lumped tuning elements 328.

The FM receiver circuitry receives the continuous wavelength signal 89 and provides a signal value 90 to the FM antenna control circuitry 68. The FM receiver circuitry 66 also provides an FM data signal 67 to the digital processing module 54.

The FM antenna control circuitry 68, based upon characteristics of the signal value 90 (such as a received signal strength indication, signal-to-noise-ratio, et cetera), produces control signals 73 to alter a center frequency of a gain profile of an FM antenna. The control signals 73 are produced according to a recovery operation mode or a tracking operation mode, which are discussed in detail with reference to FIGS. 7 through 10.

In operation, the control signals 73 control the plurality of switches $S_0$ through $S_Z$ of the external lumped element tuning array 69. In turn, the switch module 326 controls the lumped elements $C_0$ through $C_Z$ of the lumped tuning elements 328 to produce an impedance adjustment value 71. In this manner, the control signals 73 serve to change an impedance of the external lumped element tuning array 69.

Figure 5:
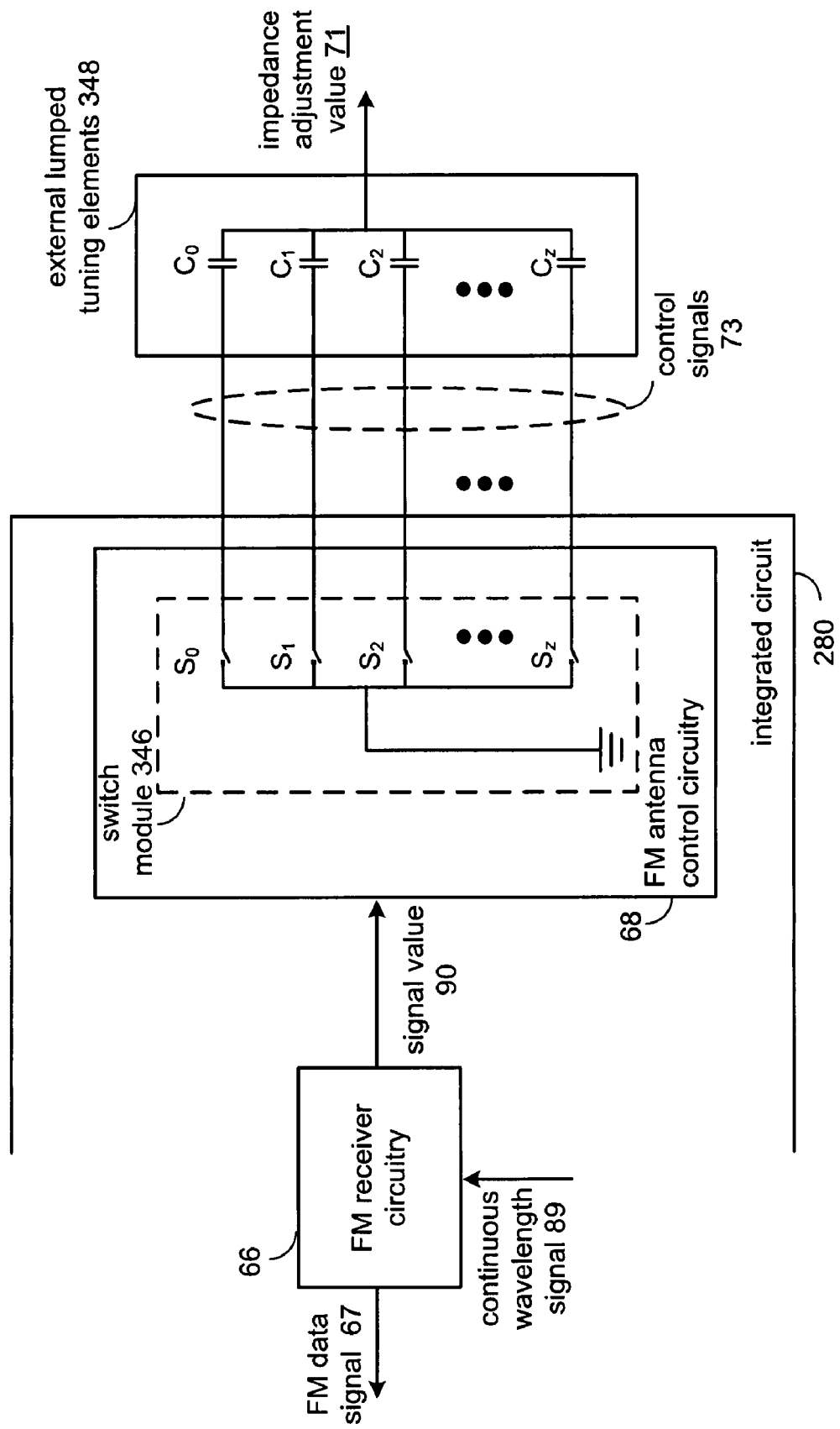
FIG. 5 is a schematic block diagram of another integrated circuit that supports wireless communications and includes FM receiver capability according to an embodiment of the present invention.

Notably, the FM antenna control circuitry 68 provides for rapid adjustment of the impedance adjustment value 71 and correspondingly, rapid tuning of an FM antenna to accommodate changing operational conditions to the wireless communication device 22-32 (see FIG. 1) in either a recovery operation mode or a tracking operation mode, FIG. 5 is a schematic block diagram of another integrated circuit 280 that supports wireless communications and includes FM receiver capability. The integrated circuit 270 includes FM receiver circuitry 66 and FM antenna control circuitry 68. The FM antenna control circuitry 68 further includes a switch module 346 with a plurality of switches $S_0$ through $S_Z$. For support of wireless communications, the integrated circuit 270 also includes wireless communication circuitry 57 with transceivers 58 through 64 (see, e.g., FIGS. 2 and 3).

The FM receiver circuitry receives the continuous wavelength signal 89 and provides a signal value 90 to the FM antenna control circuitry 68. The FM receiver circuitry 66 also provides a FM data signal 67 to the digital processing module 54 (FIGS. 2 and 3).

The FM antenna control circuit 68, via the plurality of switches $S_0$ through $S_Z$ of the switch module 346, produces control signals 73 to the external lumped tuning elements 348. The external lumped tuning elements 348 include a plurality of tuning elements $C_0$ through $C_Z$, which may be also implemented as voltage-controlled variable impedance devices (such as varactors, varicap diodes, et cetera) that are responsive to the control signals 73.

The FM antenna control circuitry 68, based upon characteristics of the signal value 90 (such as a received signal strength indication), produces control signals 73 to control a center frequency of a gain profile of an FM antenna. In operation, the FM antenna control circuitry 68 produces the control signals 73 from the plurality of switches $S_0$ through $S_Z$ to the external lumped tuning elements 348, to alter or "pull" the resonant frequency $f_C$ of the FM antenna gain profile according to whether the receiver functions in the recovery operation mode or the tracking operation mode.

The FM antenna control circuitry 68 alters the resonant frequency by changing the impedance value provided by the impedance adjustment value 71 via the lumped elements $C_0$ through $C_Z$. Accordingly, the impedance adjustment value 71 provided to an FM antenna then alters the center frequency of the gain profile of the antenna to improve reception of an FM signal.

Notably, the FM antenna control circuitry 68 provides for rapid adjustment of the impedance adjustment value 71 and correspondingly, rapid tuning of an FM antenna to accommodate changing operational conditions to the wireless communication device 22-32 (see FIG. 1) in either a recovery operation mode or a tracking operation mode.

Figure 6:
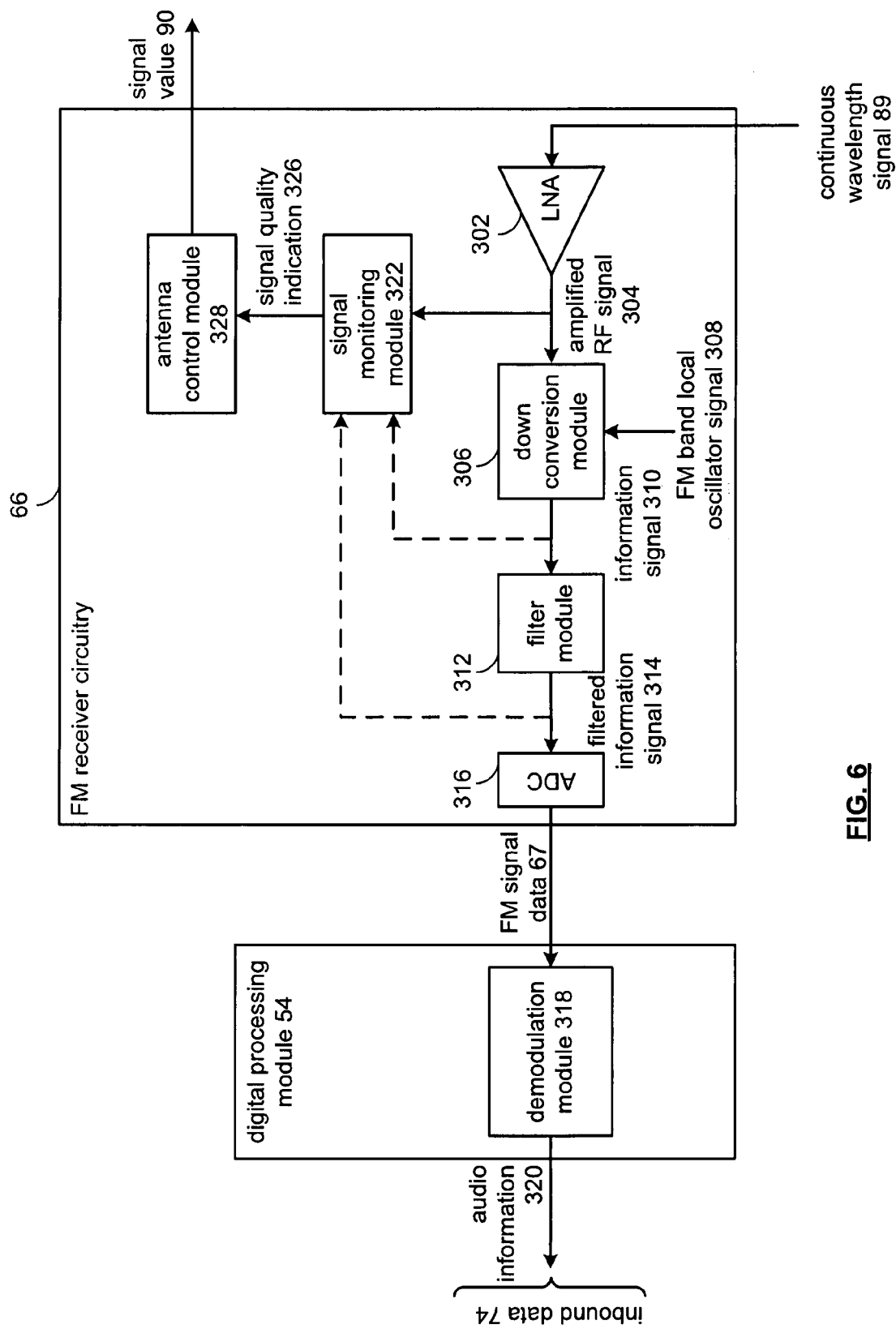
FIG. 6 is a schematic block diagram illustrating FM receiver circuitry that includes digitally-controlled antenna tuning circuitry according to an embodiment of the present invention.

FIG. 6 is a schematic block diagram illustrating the FM receiver circuitry 66 that includes digitally-controlled antenna tuning circuitry. The FM receiver circuitry 66 includes a low noise amplifier 302, a down conversion module 306, a filter module 312, an analog to digital converter 316, a signal monitoring module 322, and a control module 328. The digital processing module 54 is configured to provide a demodulation module 318.

In operation, the FM antenna 70 passes the continuous wavelength signal 89 to the low noise amplifier (LNA) 302, which produces amplified radio frequency signals 304 therefrom. The down conversion module 306 mixes the amplified radio frequency signals 304 with an FM band local oscillator signal 308 to produce an information signal 310. The FM band local oscillator signal 308 is based upon a user-selected frequency for radio station reception. The down conversion of the amplified radio frequency signal 304 may be implemented via homodyne (direct) conversion or superheterodyne (multi-stage) conversion to baseband frequencies for sampling via the analog-to-digital converter 316 for subsequent demodulation.

The filter module 312 filters the information signal 310 to produce a filtered information signal 314. The filtering performed by filter module 312 may be low pass filtering and/or bandpass filtering. The filtering module 312 may include one or more stages of resistor/capacitor circuits and/or one or more stages of inductor/capacitor circuits.

The analog to digital converter 316 converts the filtered information signal 31 into FM signal data 67. The demodulation module 318 converts the FM signal data 67 into audio information 320, which forms a portion of the inbound data 74 presented to the user interface 52 (see, e.g., FIGS. 2 and 3).

The signal monitoring module 322 measures signal quality from the amplified RF signal 304, as well as from the information signal 310, and/or the filtered information signal 314, as indicated by the hashed lines. Signal quality indicators include a received signal strength indication (RSSI), a signal-to-noise ratio (SNR), et cetera. Based upon the signal quality indicator, the receiver scans the FM band, in a recovery operation, or a portion of the FM band, in a tracking operation, for a scanned frequency having the greatest magnitude of signal quality within the scanned area.

The signal monitoring module 322 provides a signal quality indication 326 to the control module 328. The signal quality indication 326 may be in a digital or analog format, which the control module 328 processes accordingly. The signal value 90 operates to alter the center frequency of the FM antenna's gain profile, which includes a suitable gain bandwidth that is a fraction of the FM band in use.

Based upon the signal quality indication 326, the control module 328 operates to counter and/or compensate antenna performance impacted by changes in operational environmental conditions in either the recovery operation or the tracking operation. Through the signal quality indication 326, the signal monitoring module 322 conveys these changes and/or these effects on the antenna performance to the control module 328, which correspondingly adjusts the performance of the FM antenna based on the operational mode. That is, changes in the quality of the received continuous wavelength signal are sensed across an FM band or a portion thereof, and compensated for by altering the gain profile characteristics of the FM antenna to realize the improved, or recovered, signal reception—that is, the FM antenna's center frequency.

Generally, the control module 328 can alter the center frequency based upon predetermined and/or dynamic criteria. For example, the control module 328 may initially determine whether the signal quality indication is within a predetermined threshold and/or tolerance. When the signal quality indication 326 is outside the predetermined threshold, the control module 328 alters the center frequency of the FM antenna 70 (see, e.g., FIGS. 2 and 3), through the signal value 90, until the signal quality indication 326 comes within the predetermined threshold.

In a further aspect, when the station or carrier frequency is unavailable for a length of time—such as due to severe signal attenuation due to buildings, highway tunnels, or other attenuation sources, then a sleep period may be implemented to conserve the device resources, as well as discontinue processing output to a user interface, such as headphones or other audio playback devices. After the sleep period passes, then the receiver may engage in a recovery operation to processing of the signal quality indication 326.

In other aspects, the predetermined thresholds for the recovery operation and the tracking operation may be dynamic in nature. For example, each of the predetermined thresholds may be set upon an average values for the signal quality indications, or may be based upon a greatest signal quality indication (such as the greatest received signal strength indication and/or signal-to-noise ratio) within a desired tolerance level. In this manner, the sensitivity of the FM receiver circuitry 66 may be increased or decreased to changes in the operational environment for the FM receiver circuitry 66. Reducing the rate in which the FM receiver circuitry 66 tracks changes to the operational environment correspondingly serves to conserve device resources, such as processing and/or power resources.

As may be appreciated by one of ordinary skill in the art, the integrated circuit implementing the FM receiver circuitry may also incorporate FM antenna control circuitry 68, such as that illustrated in FIGS. 3 through 5. The FM antenna control circuitry 68 includes a switch module 326 coupled to lumped tuning elements 328. The positions of the switches of the switch module 326 are based upon the signal value 90, and operate to affect an impedance of the lumped tuning elements 328 to produce an impedance adjustment value 71 that correspond to the signal value to alter the center frequency of a gain profile of the FM antenna.

Further, with respect to implementation of the FM receiver circuitry, a separately defined integrated circuit may include the switch module 326 and/or the lumped tuning elements 328 in various integrated circuit structures to accommodate fabrication, operational, and/or design considerations.

Figure 7:
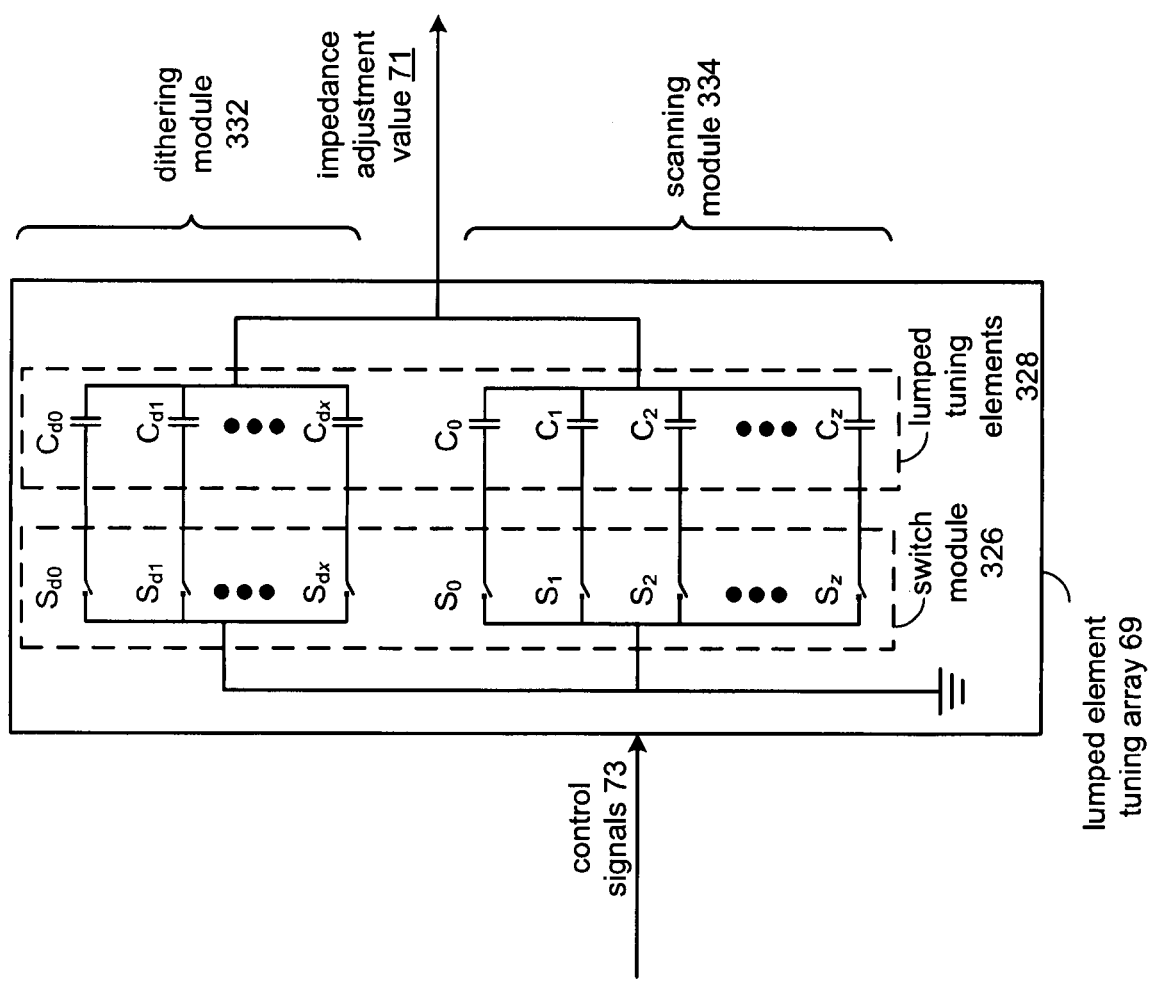
FIG. 7 is a block diagram of a lumped element tuning array that includes a dithering module and a scanning module according to an embodiment of the present invention.

FIG. 7 is a block diagram of a lumped element tuning array 69 with a dithering module 332 and a scanning module 334 implemented in the switch module 326 and the lumped tuning elements 328. Dithering module 332 and the scanning module 334 operate to limit the audible noise introduced to a user of the receiver based upon a tracking operation and/or a recovery operation. Audible noise may be introduced upon interruption of a continuous wavelength signal, upon interference introduced by changes in the physical environment of the receiver, and by the receiver operations that attempts to recover and/or refine reception of the continuous wavelength signal.

The scanning module 334 includes a plurality of switches $S_0$ through $S_Z$ that are coupled to a first portion of the lumped tuning elements 328 that include a plurality of tuning elements $C_0$ through $C_Z$. The tuning elements $C_0$ through $C_Z$ are sized to provide a scanning frequency interval, in which the gain profile of the FM antenna 86 may be adjusted to scan frequencies across the operational frequency band (such as the FM frequency band). For example, the number of tuning elements $C_0$ through $C_Z$ implemented provide a desired level of resolution with respect to the size of the scanning frequency intervals. That is, with a number of tuning elements associating with six bits, a resolution of about 1 MHz may be realized. With the number of tuning elements associating with seven bits, a resolution about 0.5 MHz resolution may be realized. As one of ordinary skill in the art may appreciate, other configurations may be implemented for achieving a desired resolution.

The dithering module 332 includes a plurality of switches $S_{d0}$ through $S_{dx}$ that are respectively coupled to a second portion of the lumped tuning elements 69 that includes a plurality of tuning elements $C_{d0}$ through $C_{dx}$. The tuning elements $C_{d0}$ through $C_{dx}$ are sized to provide a dithering frequency interval, in which the gain profile of the FM antenna 86 may be adjusted to frequency hop at this interval to dither a frequency subset of the operational frequency band of the receiver. Also, the tuning elements $C_{d0}$ through $C_{dx}$ provide for tracking typically at 0.5 MHz around a center frequency setting established by the tuning elements $C_0$ through $C_Z$ of the scanning module 334.

The scanning frequency interval is greater than the dithering frequency interval. In operation, the scanning module 334—for channel frequency scanning purposes—provides coarser adjustment to the gain profile the FM antenna for scanning the FM band, and the dithering module—for refined adjustments—provides finer adjustments to the gain profile of the FM antenna for dither scanning a frequency subset of the FM band. In this manner, the receiver is capable of operating in a recovery mode to scan the FM band for frequency channels, and a tracking mode of operation for dithering a subset of frequencies about a given frequency channel.

The receiver enters a recovery mode of operation when signal reception is interrupted. Signal reception is interrupted, for example, upon startup, when they antenna 68 instantaneously listings with a complete loss of the signal, complete blocks or loss of the signal due to the physical environment (such as entering a road tunnel), et cetera. Operation of the scanning modules 334 and recovery operation mode for the receiver is discussed in greater detail with reference to FIG. 8.

The receiver enters a tracking mode when a varying rate of reception occurs due at least in part to the physical environment at the receiver. The varying rate is typically less than 10 kHz, which permits dithering of the gain profile of the FM antenna about a channel frequency to acquire the greatest signal strength associated with that channel. Operation of the dithering module 332 and tracking operation mode for the FM receiver is discussed in greater detail with reference to FIG. 9.

Figure 8:
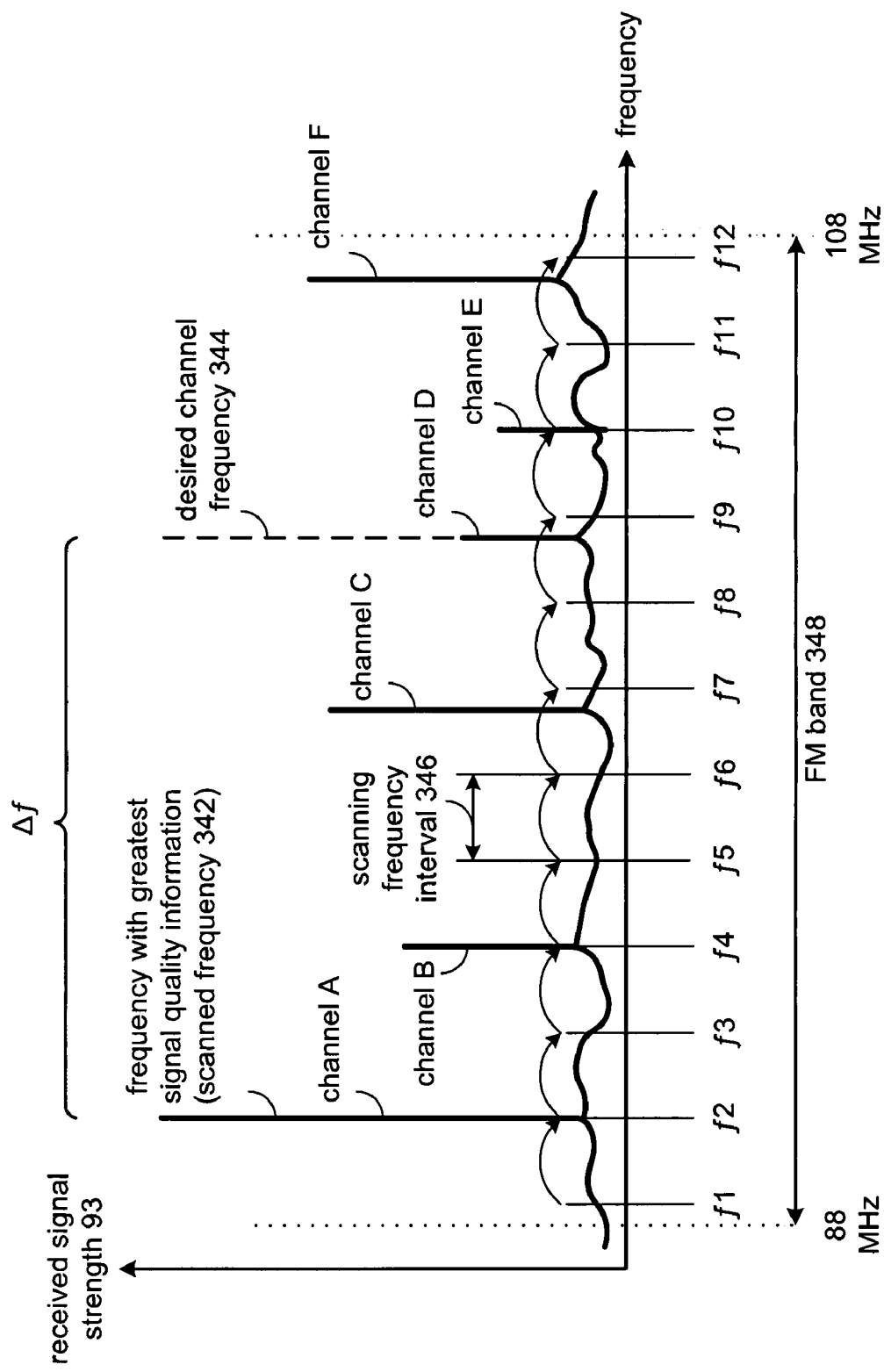
FIG. 8 illustrates operation of the FM receiver in a recovery mode according to an embodiment of the present invention.

FIG. 8 illustrates operation of the receiver in a recovery mode. The graph depicts channel frequencies A through F associated with the FM band 348. Each channel frequency has an associated signal quality information indicating the strength of that signal. As shown, each of the channel frequencies may have a respective signal quality information associated with it that varies between the channels. The signal quality information may be a function of broadcast strength, distance from transmitter (or signal attenuation), physical interference (for example tunnels and/or building structures, et cetera), et cetera.

Following interruption and/or disruption of the received signal, the receiver scans the FM band for channel frequencies to establish a strongest signal, generally within a period of less than 5 μs. The received signal strength 93 versus the frequency for the FM band 348 for FM station channels A through F.

When in a recovery mode, the transceiver experiences an interruption and/or disruption in reception of the continuous wavelength signal, which is indicated when the signal quality information for a channel frequency drops below a predetermined performance threshold. During the interruption and/or disruption, signal quality information levels for each of the channels may change, alter, or otherwise not return. To recover the continuous wavelength signal, the receiver begins frequency hopping across the FM frequency band 348 at a scanning frequency interval 346.

Through scanning the FM band 348, the receiver determines a scanned frequency that has a greatest signal quality information of the scanned frequencies within the FM frequency band. As may be appreciated by one of ordinary skill in the art, multiple offset passes across the FM band 348 may be used to interleave the scanning pattern across the FM band 348 to provide further detailed scanning of the FM band. Further, the scanning frequency interval 346 may be implemented as an integer multiple of an interval value.

Also, when the station or carrier frequency is unavailable for an extended length of time—such as due to severe signal attenuation due to buildings, highway tunnels, or other attenuation sources, a sleep period may be implemented to conserve the device resources, such as battery power. In addition, the receiver may discontinue processing output to a user interface, such as headphones or other audio playback devices to also conserve device resources. After the sleep period lapses, then the receiver may continue in a recovery operation to processing the signal quality indication 326.

In the present example, frequency channel E, detected with respect to frequency hop at f10, has the lowest received signal strength 93. Frequency channel A, detected with respect to frequency hop f2, has the greatest signal quality information of the channels. Accordingly, frequency channel A is the scanned frequency 342 having the greatest signal quality information of the scanned frequencies within the FM frequency band 348.

Further, with the instance that a user has indicate a desired channel frequency 344, the receiver alters the center frequency of the gain profile of the FM antenna based upon the difference, Δf, of the scanned frequency 342 with the desired channel frequency 344. The adjustment may be provided in the form of a lookup table to provide the impedance value for the given difference Δf.

In all, the receiver recovery operation, once the cause of the interruption and/or disruption passes, limits the audible noise introduction to a user with sufficiently rapid reacquisition of the frequency channels for the FM band 348, and alters the center frequency of a gain profile of the FM antenna 68 to that of scanned frequency 342 having the greatest signal quality information with respect to the other scanned frequencies within the band.

Figure 9:
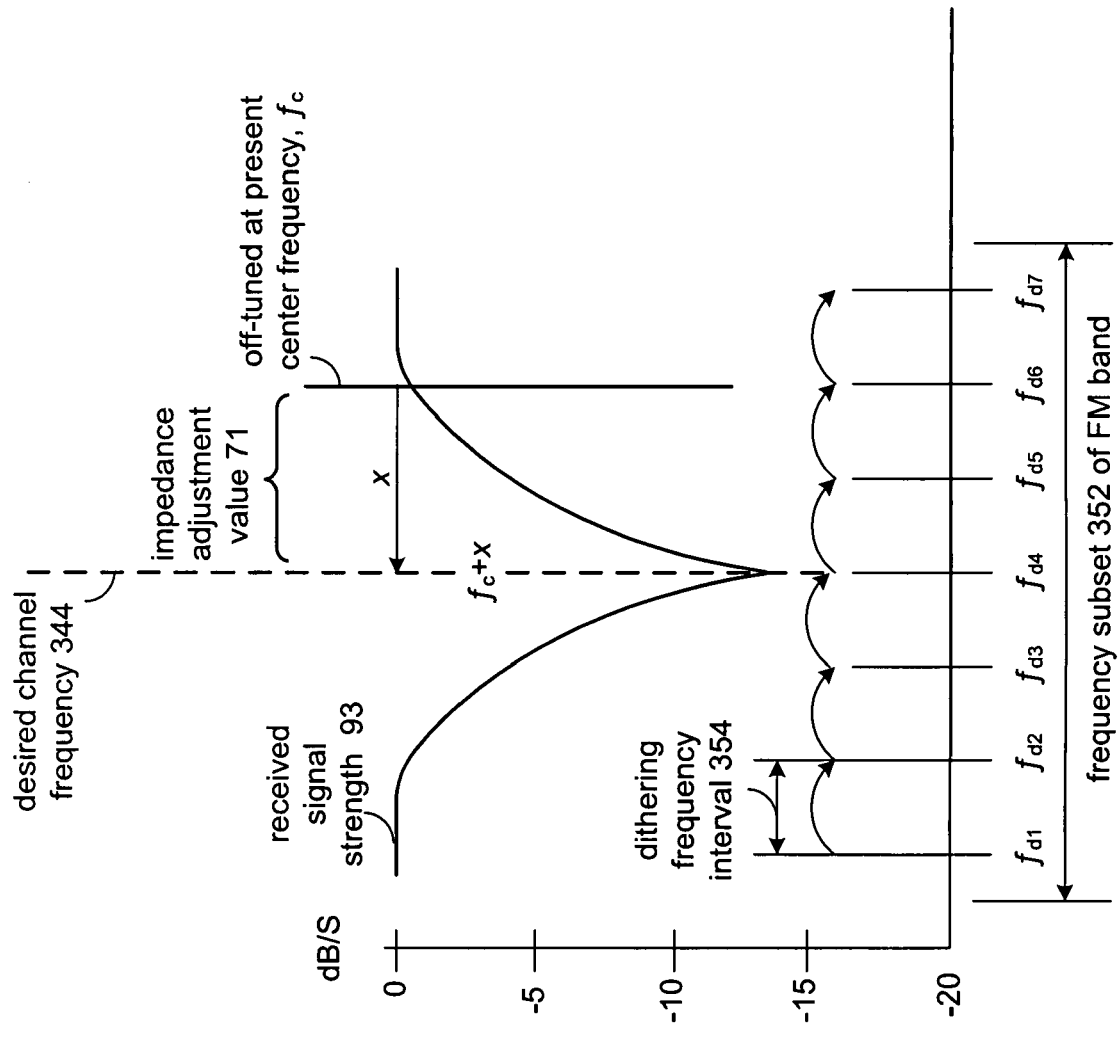
FIG. 9 illustrates operation of the FM receiver in a tracking operation according to an embodiment of the present invention.

FIG. 9 illustrates operation of the receiver in a tracking operation. In general, the operational environment affects the center frequency of the gain profile for an antenna 68, which may deviate from the strongest or most robust portion of the desired frequency value. In the present example, the gain profile is represented as a received signal strength 93. In this example, the center frequency $f_C$ is "off-tuned" by a value "x." That is, the antenna 68 is not centered with respect to the desired channel frequency 344. Unless the antenna tuning is corrected, the signal data may be distorted when processed for playback to a user (such as with static, reverting to mono playback, et cetera), or additional power resources may be needed to correct the distortion.

The magnitude in which the center frequency $f_C$ is "off-tuned" corresponds, in part, to the changing operational environment. That is, the impedance changes (such as the varying proximity of a user) affect the antenna center frequency $f_C$. The FM antenna control circuitry provides control signals to produce an impedance adjustment value 71 to alter the tuning for the antenna.

Although the impedance adjustment value 71 is shown to center the antenna center frequency $f_C$ with the received signal strength, the FM antenna control circuitry 68 may also provide control signals that provide a tuning offset to take advantage of smoother amplifier characteristics across a greater bandwidth.

To adjust and or determine the impedance adjustment value, when the signal quality information drops below a second predetermined performance threshold, the receiver frequency hops across a subset 352 of the FM frequency band at a dithering frequency interval 354. The frequency subset 352 includes the present center frequency of the gain profile of the FM antenna. The receiver determines a dithered frequency dithered frequency having a greatest signal quality information from a plurality of dithered frequencies within the frequency subset 352 of the FM frequency band. The receiver sets the center frequency of the gain profile of the FM antenna to the frequency of the dithered frequency having the greatest signal quality information, which will correspond to the desired channel frequency 344.

Further, with respect to the frequency subset 352 of the FM band, the receiver may enter a recovery operation, in which the receiver periodically frequency hops at the scanning frequency interval to ensure that the frequency subset includes appropriate portions of the FM frequency band.

Figure 10:
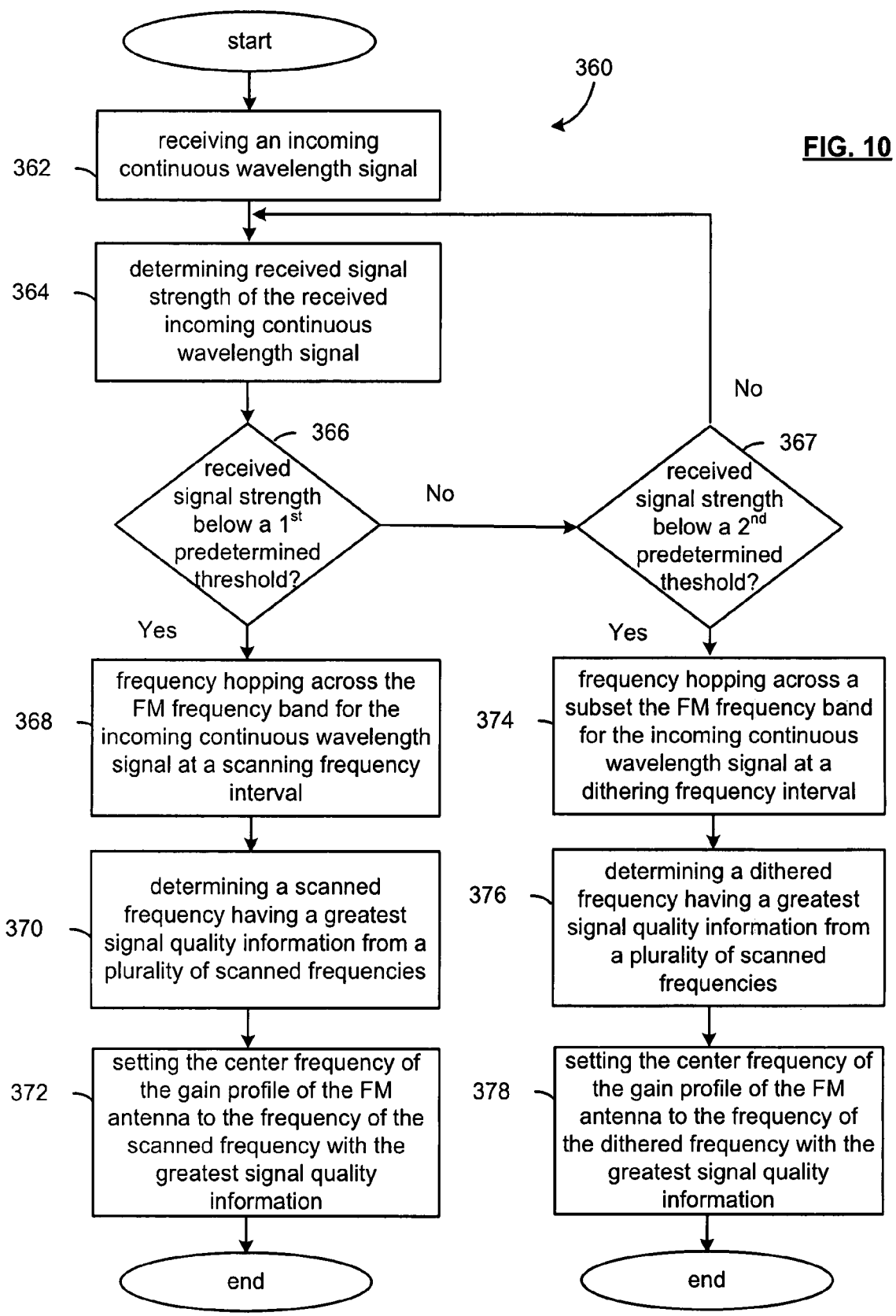
FIG. 10 is a flow diagram that illustrates a method to limit audible noise introduction through tuning of the FM antenna according to an embodiment of the present invention.

FIG. 10 is a flow diagram that illustrates a method 360 to limit audible noise introduction through tuning an FM antenna.

Beginning at step 362, the receiver receives an incoming continuous wavelength signal that corresponds to an FM frequency band. The receiver, at step 364, determines signal quality information of the received incoming continuous wavelength signal.

At steps 366 and 367, the receiver determines the nature of the signal strength indication—whether it is below a first predetermined threshold associated with initiating recovery operation, or a second predetermined threshold associated with initiating tracking operation. That is, the first predetermined threshold is used to indicate when the continuous wavelength signal has insufficient signal strength, such as when the signal is lost or severely attenuated (for example, when the signal is obstructed or out of range). The second predetermined threshold is used to indicate when there is sufficient signal strength, but a stronger signal can be obtained (for example, when operational environmental conditions for the receiver have changed).

When the signal quality information drops below the first predetermined threshold, then at step 368, in a recovery mode of operation, the receiver engages in frequency hopping across the FM frequency band at a scanning frequency interval. The receiver engages in the frequency hopping by altering the center frequency of the gain profile of the FM antenna with the lumped tuning circuitry. At step 370, the receiver determines the scanned frequency having a greatest signal quality information from the plurality of scanned frequencies within the FM frequency band. With the scanned frequency having the greatest signal quality information, the receiver at step 372 sets the center frequency of the gain profile of the FM antenna to the frequency of the scanned frequency with the greatest signal quality information. From this point, the method may end, or as may be appreciated by one of ordinary skill in the art, repeat the method at periodic intervals to limit the audible noise introduced to a user of the receiver. Further, frequency hopping at the scanning frequency interval may also occur periodically to ensure that the frequency subset includes appropriate portions of the FM frequency band.

At step 366, when the received signal strength does not fall below the first predetermined threshold, then at step 367, the receiver determines whether the received signal strength falls below the second predetermined threshold. When the signal quality information drops below the second predetermined performance threshold, then at step 374, the receiver engages in frequency hopping across a subset of the FM frequency band at a dithering frequency interval. The frequency subset includes a present center frequency of the gain profile of the FM antenna. For greater granularity or refined adjustment of the gain profile for the FM antenna, the dithering frequency interval is less than the scanning frequency interval. At step 376, the receiver determines a dithered frequency having a greatest signal quality information from a plurality of dithered frequencies within the frequency subset of the FM frequency band. With this determination, the receiver at step 378 sets the center frequency of the gain profile of the FM antenna to the frequency of the dithered frequency having the greatest signal quality information. From this point, the method may end, or as may be appreciated by one of ordinary skill in the art, repeat the method at periodic intervals to limit the audible noise introduced to a user of the receiver. As a further measure to limit the introduction of audible noise, the frequency hopping, at either interval, occurs at a rate sufficient to avoid audible detection.

Figure 11:
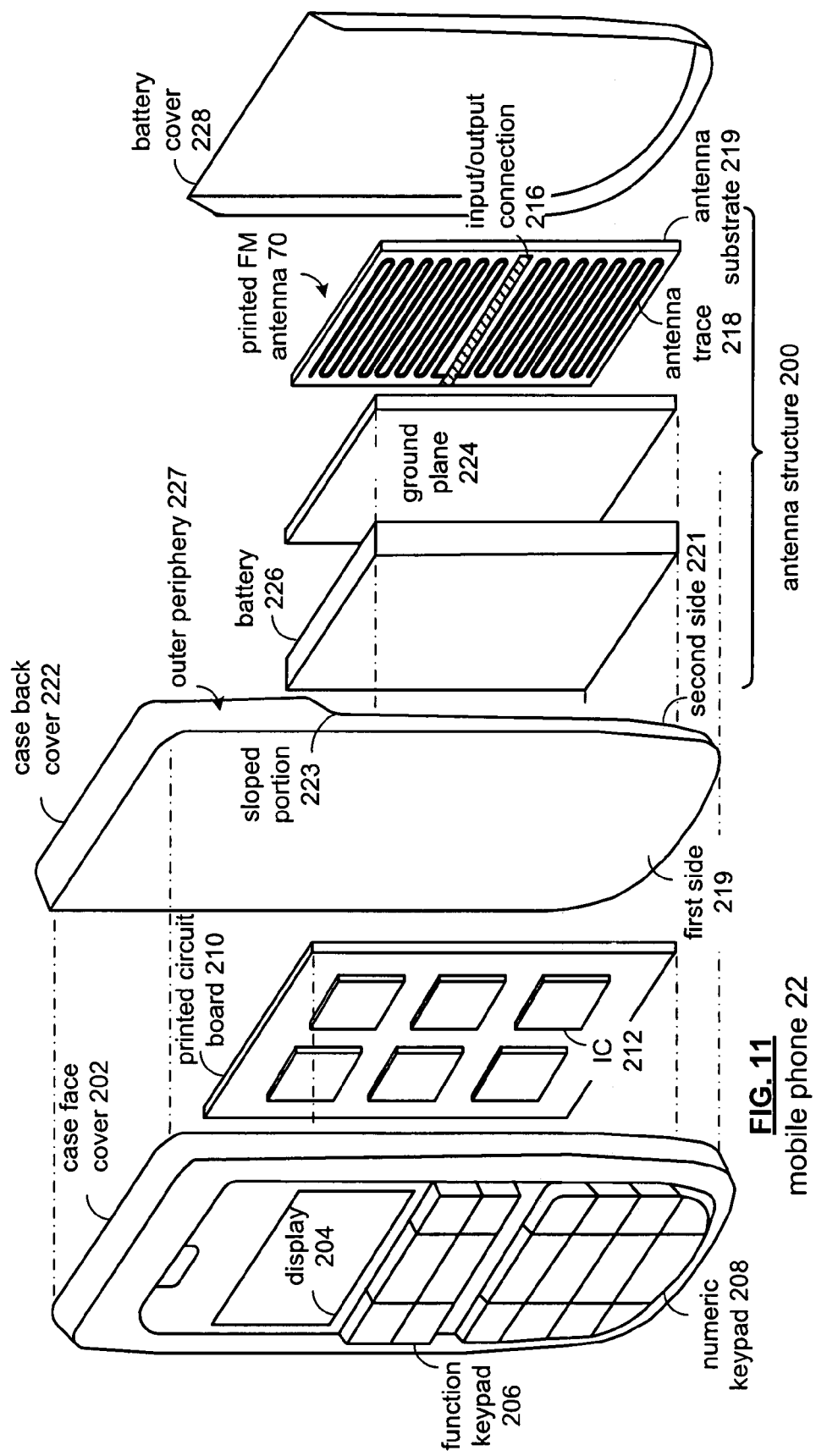
FIG. 11 is an exploded view of a mobile phone with a brick configuration that includes an antenna structure according to an embodiment of the present invention.

FIG. 11 is an exploded view of a mobile phone 22 having an antenna structure 200. The mobile phone 22 has a structure sometimes referred to as a "brick." The mobile phone 22 includes a case face cover 202, a case back cover 222, and a battery cover 228. The case face cover 202 includes a display 204, a function keypad 206, and a numeric keypad 208. The case face cover 202 receives a printed circuit board 210 having integrated circuits 212, which include transceivers 58-66 (such as that discussed with reference to FIGS. 2-10) that is coupled to a FM antenna 70 of the antenna structure 200.

Further, the printed circuit board 210 may include lumped tuning components to initially match the impedance of the mobile phone 22 with the FM antenna 70. The case back cover 222 includes a first side 219 and a second side 221. The second side 221 defines a sloped portion 223 to receive the battery cover 228.

The mobile phone 22 supports different forms of communication and information and/or media content. For example, in addition to supporting voice calls, the mobile phone 22 can also send and receive data, send text messages via a Short Messaging Service ("SMS"), access Wireless Application Protocol ("WAP") services, provide Internet access through data technologies such as General Packet Radio Service ("GPRS"), sending and receiving pictures with built-in digital cameras, video and sound recording, et cetera. Additionally, local features may be available with the mobile phone 22 such as alarms, volume control, user defined and downloadable ring tones and logos, interchangeable covers, et cetera.

The antenna structure 200 includes the FM antenna 70, a conductive material forming a ground plane 224, and the battery 226. The FM antenna 70 includes an antenna trace 218, and an input/output connection 216. The FM antenna 70 has a planar structure that is less than a planar area of the battery cover 228, and is positioned adjacent the inside of the battery cover 228. The FM antenna 70 may have a variety of configurations that are designed according to varying criteria (see, e.g., FIG. 2-5).

Also, the FM antenna 70 may be implemented on one or more printed circuit board layers and/or one or more integrated circuit layers. The coupling of the transceiver circuitry of the integrated circuits 212 with the FM antenna 70 may be direct or indirect and positioned on the FM antenna 70 to achieve a desired load impedance. For example, the input/output connection 216 may be a coaxial probe, a printed microstrip, a waveguide, and a coplanar transmission line, et cetera.

A battery 226 has a planar structure and is positioned adjacent a second side of the ground plane 224, such that the planar structure of the antenna 70 and of the battery 226 are substantially parallel. The ground plane 224, which is positioned between the battery 226 and the FM antenna 70, operates to improve a signal-to-noise performance of the FM antenna 70. The battery 226 may have a conductive outer layer that provides the ground plane 224 to the FM antenna 70. The battery cover 228, case back cover 222, and the case face cover 202 couple to provide the electrical and physical connectivity for operation of the mobile phone 22.

Figure 12:
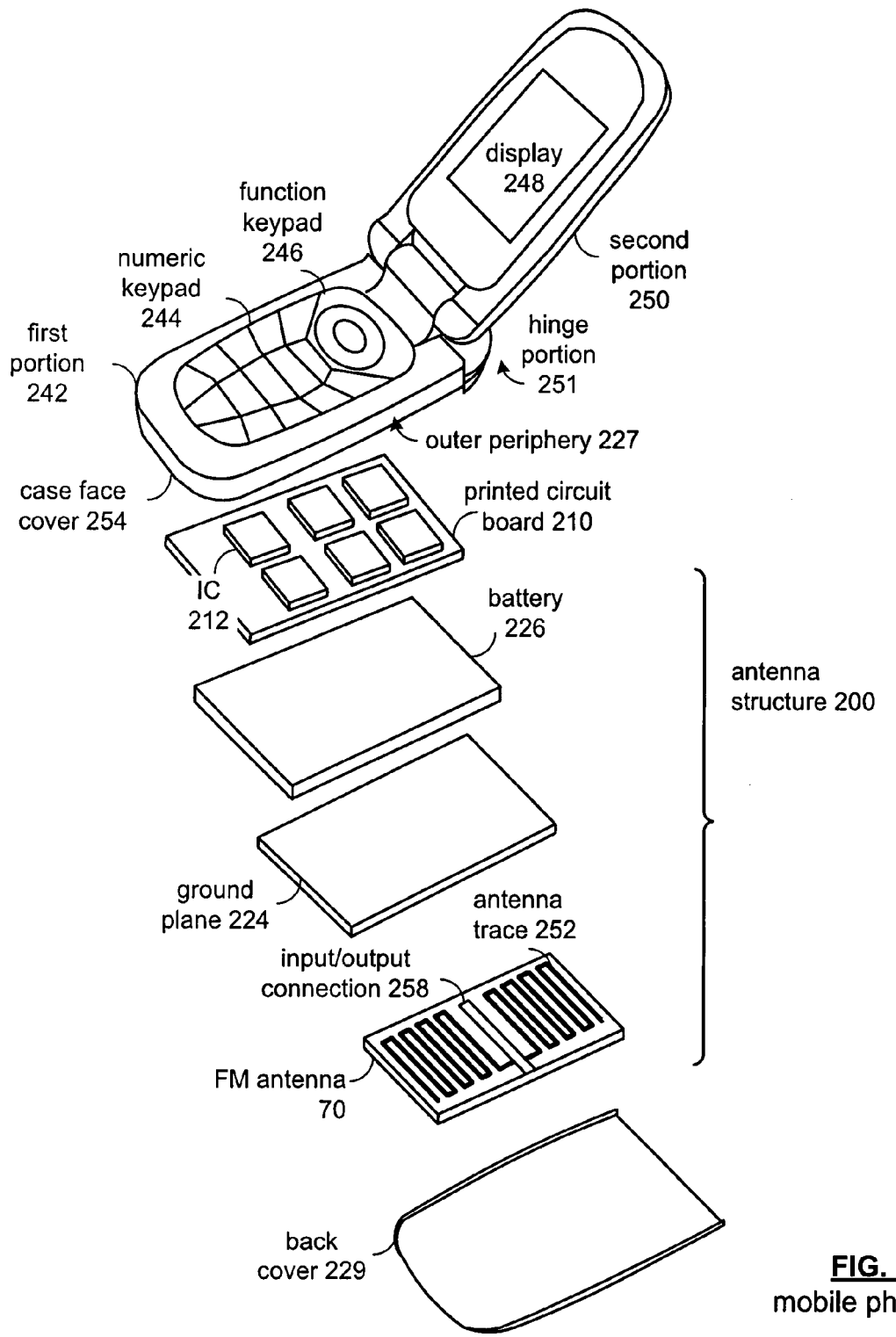
FIG. 12 is an exploded view of a mobile phone with a clamshell configuration that includes an antenna structure according to an embodiment of the present invention.

FIG. 12 is an exploded view of a mobile phone 28 having an antenna structure 200. The mobile phone 28 has a structure sometimes referred to as a "clamshell" structure. The mobile phone 28 supports different forms of communication and media information content. For example, in addition to supporting voice calls, the mobile phone 28 can also send and receive data, send text messages via a Short Messaging Service ("SMS"), access Wireless Application Protocol ("WAP") services, provide Internet access through data technologies such as General Packet Radio Service ("GPRS"), sending and receiving pictures with built-in digital cameras, video and sound recording, et cetera. Additionally, local features may be available with the mobile phone 28 such as alarms, volume control, user defined and downloadable ring tones and logos, interchangeable covers, et cetera.

The mobile phone 28 includes a first portion 242 and a second portion 250. The first portion 242 includes a keypad 244, a function keypad 246, and a case face cover 254. The first portion 242 also receives a FM antenna 70, and a battery 226, each of which being separated by a ground plane 224. The battery 226, ground plane 224, and the FM antenna 70 may be formed as a unit with the back cover 229. The second portion 250 of the mobile phone 28 includes a display 248 for relaying call status and other information that may be retrieved and presented to the user. The first portion 242 and the second portion 250 fold along a hinge portion 251 to a substantially parallel position when placed in a closed position.

The mobile phone 28, via the first portion 242, receives a printed circuit board 210 having integrated circuits 212, which include transceiver circuitry 58-66. The FM transceiver 66 is coupled to the FM antenna 70.

The first portion 242 of the clamshell structure provides a smaller footprint space and/or area for the FM antenna 70. Accordingly, the performance of the printed FM antenna is more readily influenced by changes in its operational environment by impedance changes caused by a user and/or other objects. In this regard, the ground plane 224 serves to mitigate these influences and to further improve the performance of the printed FM antenna with respect to signal reception. Also, the printed circuit board may include lumped tuning components, which compensate for impedances introduced by the mobile phone components, initially tuning the FM antenna 70 to the wireless communication device 22-32.

The FM antenna 70 includes an antenna trace 252, and an input/output connection 258. The FM antenna 70 has a planar structure that is less than a planar area of the first portion 242 of the phone 28, and is positioned adjacent the ground plane 224. The FM antenna 70 may be implemented on one or more printed circuit board layers and/or one or more integrated circuit layers. The coupling of the transceiver circuitry of the integrated circuits with the FM antenna 70 may be direct or indirect, and positioned on the FM antenna 70 to achieve a desired load impedance. For example, the input/output connection 216 may be a coaxial probe, a printed microstrip, a waveguide, and a coplanar transmission line, et cetera.

The FM antenna 70 may be provided under a variety of configurations depending upon the desired operational characteristics. Examples of the varying configurations are discussed in detail with respect to FIG. 2.

The battery 226 has a planar structure that is positioned adjacent a second side of the ground plane 224, such that the planar structure of the FM antenna 70 and of the battery 226 are substantially parallel to each other in a spaced apart relation to improve the performance of the FM antenna 70. The battery 226, ground plane 224, FM antenna 70, and back cover 229 may be integrated into a module that detachably couples with the first portion 242 to provide the electrical and physical connectivity for operation of the mobile phone 28. Further, the ground plane 224 may be formed as a conductive layer to the battery 226.

FIG. 13 is a cross-sectional diagram of the antenna structure 200. The antenna structure 200 includes the FM antenna 70 and the battery 226 with the ground plane 224 in a layered relation. The antenna trace 218 is electrically insulated from the ground plane 224 by a protective layer 225. The FM antenna 70 has a planar structure that is less than a planar area defined by the outer periphery of the mobile phone battery cover 228, and is positioned such that the antenna substrate 219 is adjacent the inner side of the battery cover 228. The antenna trace 218 is oriented towards the ground plane 224.

The antenna substrate 219 may be formed with the battery cover 288, and further may be coupled to, or form a portion of, the inner surface of the battery cover 228. The protective layer 225 and the antenna substrate 219 are made of a dielectric material that provides electrical insulation between mobile phone components while supporting electrostatic fields. Further, the dielectric material has a dielectric constant sufficient to concentrate electrostatic lines of flux while dissipating minimal energy in the form of heat. Examples of materials include air, polyethylene, polystyrene, et cetera. The planar structure of the FM antenna 70, the ground plane 224, and the planar surface of the battery 226 are substantially parallel to each other. The sandwiched structure provides improved FM signal reception for the FM antenna 70.

FIG. 14 is a cross-sectional diagram of the antenna structure 239. The antenna structure 239 illustrates another sandwich structure that may be used in the mobile phones 22 and/or 28. The antenna structure 200 includes the FM antenna 70 and the battery 226 with the ground plane 224 in a layered relation. The antenna trace 218 is electrically insulated and/or mechanically protected by a protective layer 225. The FM antenna 70 has a planar structure that is less than a planar area defined by the outer periphery of the mobile phone battery cover 228, and is positioned such that the antenna substrate 219 is adjacent the ground plane 224. The antenna trace 218 is adjacent the inner surface of the battery cover 228. Accordingly, the planar structure of the FM antenna 70, the ground plane 224, and the planar surface of the battery 226 are substantially parallel to each other. The sandwiched structure provides improved FM signal performance for the FM antenna 70.

Figure 15:
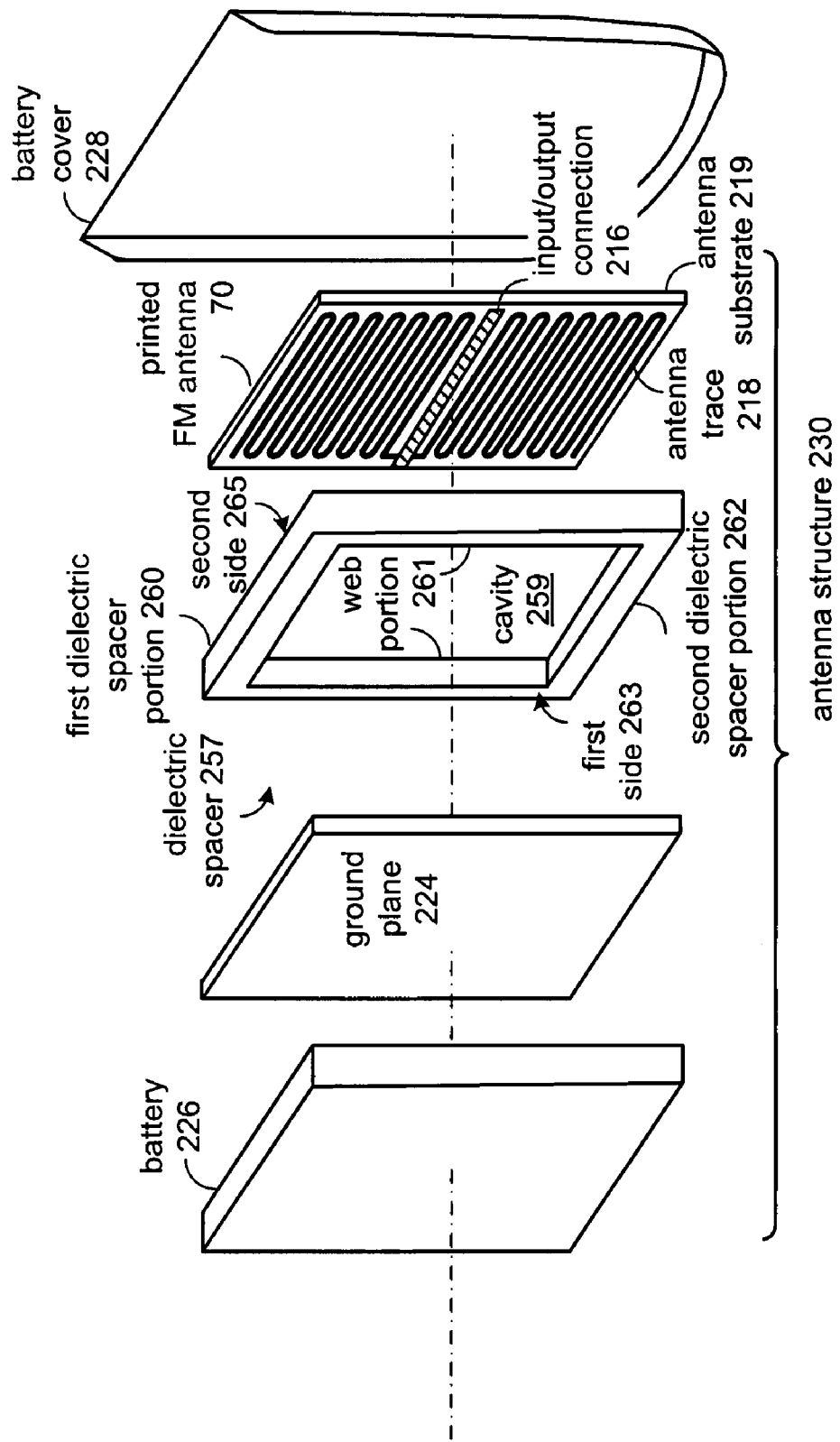
FIG. 15 is an exploded view of another antenna structure including a dielectric spacer according to a further embodiment of the present invention.

FIG. 15 is an exploded view of a further antenna structure 230 implementing a dielectric spacer 257. The antenna structure 230 may be used in the brick structure of the mobile phone 28 and/or the clamshell structure of the mobile phone 28, as well as other suitable wireless device structures.

The antenna structure 230 includes the FM antenna 70 and the battery 226 in a spaced-apart relation via a dielectric spacer 257. The dielectric spacer 257 includes a first dielectric spacer portion 260 and a second dielectric spacer portion 262. The dielectric spacer 257 also includes web portions 261 that space the first and dielectric spacer portion 260 and 262 in a fixed relation, providing a first side 263 and a second side 265. The dielectric spacer 257 provides further separation between the battery 226 and the FM antenna 70, which services to improve the E-M flux characteristics of the printed FM antenna, and improves the performance of the FM antenna 70.

The dielectric spacer 257 has different dielectric constants that are attributed to the components of the dielectric spacer 257 and the cavity 259 defined therein, which may be "filled" with air from the surrounding environment. Also, the dielectric space 257 may be formed of a similar material throughout, or formed with multiple materials with different dielectric properties.

In this manner, the dielectric spacer 257 provides electrical insulation between the FM antenna 70 and mobile phone components, while also supporting electrostatic fields. In general, the area of the dielectric spacer 257 substantially corresponds to the surface area of the FM antenna 70; however, dielectric spacers with smaller surface areas may also be used while the desired improvement to the performance of the printed antenna 256 is realized.

The FM antenna 70 has a planar structure less than a planar area defined by the outer periphery of the battery cover 228, and is positioned adjacent the inner surface of the mobile phone battery cover 228. The battery 226 has a planar surface positioned adjacent the ground plane 224, which may be a conductive outer layer of the battery 226. The conductive outer layer of the battery 226 may partially encase the battery 226 such that the ground plane 224 is positioned between the battery 226 and the FM antenna 70. The sandwiched antenna structure 230 provides improved FM signal performance for the FM antenna 70.

FIG. 16 is a cross-sectional diagram of the antenna structure 230 of FIG. 12 with the dielectric spacer 257 and a gap 231 between the antenna structure 230 and the battery cover 228.

The antenna structure 230 includes the FM antenna 70 and the battery 226 in a spaced-apart relation via the dielectric spacer 257. The FM antenna 70 has a planar structure generally corresponding to the dielectric spacer 257 and a conductive layer that provides the ground plane 224. The FM antenna 70 has a protective layer 225 and an antenna trace 218, which face adjacent to a first side of the dielectric spacer 257. A conductive layer forming a ground plane 224 is positioned adjacent a second side of the dielectric spacer 257, and the battery 226 is in turn adjacent the ground plane 224.

In this manner, the planar structure of the FM antenna 70 and the planar surface of the battery 226 are substantially parallel to each other in a spaced-apart relation, which serves to improve the FM performance of the FM antenna 70. Further, the gap 231 provides a further dielectric effect with respect to the antenna structure 230, in that a level of electrical insulation between the antenna structure 231 and the case covers is provided while supporting electrostatic fields conducive to FM antenna operation.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (that is, where one element is coupled to another element by inference) includes direct and indirect coupling between two elements in the same manner as "coupled". As one of average skill in the art will further appreciate, the term "compares favorably", as may be used herein, indicates that a comparison between two or more elements, items, signals, et cetera, provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal. While the transistors or switches in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

What is claimed is:

1. A method to limit audible noise introduction through FM antenna tuning, in which an FM antenna is coupled with lumped tuning circuitry to alter a center frequency of a gain profile of the FM antenna, the method comprises:
   receiving an incoming continuous wavelength signal that corresponds to an FM frequency band;
   determining signal quality information of the received incoming continuous wavelength signal; and
   when the signal quality information drops below a predetermined performance threshold,
      frequency hopping across the FM frequency band at a scanning frequency interval by altering the center frequency of the gain profile of the FM antenna with the lumped tuning circuitry;
      determining a scanned frequency having a greatest signal quality information from a plurality of scanned frequencies within the FM frequency band; and
      setting the center frequency of the gain profile of the FM antenna to the frequency of the scanned frequency with the greatest signal quality information.

2. The method of claim 1, wherein the setting the center frequency of the gain profile of the FM antenna to the scanned frequency having the greatest signal quality information comprises:
   determining the frequency associated with the scanned frequency having the greatest signal quality information; and
   altering the center frequency of the gain profile of the FM antenna based upon the difference of the scanned frequency with a desired channel frequency.

3. The method of claim 2 wherein the altering the center frequency of the gain profile of the FM antenna comprises:
   changing an impedance of the lumped tuning circuitry.

4. The method of claim 1 further comprises:
   when the signal quality information drops below a second predetermined performance threshold,
      frequency hopping across a subset of the FM frequency band at a dithering frequency interval, the frequency subset includes a present center frequency of the gain profile of the FM antenna, wherein the dithering frequency interval is less than the scanning frequency interval;

determining a dithered frequency having a greatest signal quality information from a plurality of dithered frequencies within the frequency subset of the FM frequency band; and setting the center frequency of the gain profile of the FM antenna to the frequency of the dithered frequency having the greatest signal quality information.

5. The method of claim 4, wherein the frequency hopping at the scanning frequency interval occurs periodically to ensure that the frequency subset includes appropriate portions of the FM frequency band.

6. The method of claim 1 wherein the frequency hopping occurs at a rate sufficient to avoid audible detection.

7. The method of claim 6 wherein the rate is at least 1.0 MHz.

8. The method of claim 1 wherein the signal quality information comprises at least one of a measured received signal strength and a measured signal-to-noise ratio (SNR).

* * * * *